US011695375B2

(12) United States Patent
Schultz et al.

(10) Patent No.: US 11,695,375 B2
(45) Date of Patent: Jul. 4, 2023

(54) POWER AMPLIFIER WITH A POWER TRANSISTOR AND AN ELECTROSTATIC DISCHARGE PROTECTION CIRCUIT ON SEPARATE SUBSTRATES

(71) Applicant: NXP USA, Inc., Austin, TX (US)

(72) Inventors: Joseph Gerard Schultz, Wheaton, IL (US); Yu-Ting David Wu, Schaumburg, IL (US); Nick Yang, Wilmette, IL (US)

(73) Assignee: NXP USA, Inc., Austin, TX (US)

( * ) Notice: Subject to any disclaimer, the term of this patent is extended or adjusted under 35 U.S.C. 154(b) by 245 days.

(21) Appl. No.: 17/110,568

(22) Filed: Dec. 3, 2020

(65) Prior Publication Data

US 2022/0182022 A1 Jun. 9, 2022

(51) Int. Cl.
*H03F 3/21* (2006.01)
*H03F 3/195* (2006.01)
(Continued)

(52) U.S. Cl.
CPC ............ *H03F 3/195* (2013.01); *H01L 23/60* (2013.01); *H01L 23/66* (2013.01); *H01L 24/49* (2013.01);
(Continued)

(58) Field of Classification Search
CPC .......... H03F 3/2176; H03F 1/22; H03F 3/191; H03F 1/0288
(Continued)

(56) References Cited

U.S. PATENT DOCUMENTS

| 5,942,946 A | * | 8/1999 | Su ........................ H03F 3/1935 330/285 |
| 6,046,642 A | * | 4/2000 | Brayton .............. H03F 3/45538 330/296 |
| 6,465,768 B1 | | 10/2002 | Ker et al. |
| RE38,319 E | | 11/2003 | Lin et al. |

(Continued)

FOREIGN PATENT DOCUMENTS

| EP | 2 234 159 B1 | 7/2017 |
| EP | 2526618 B1 | 8/2018 |
| JP | 3729082 B2 | 12/2005 |

OTHER PUBLICATIONS

NXP Semiconductors; Technical Data—3.6 GHz Low Power Amplifier Module—AFLP5G35645, Rev. 1; 12 pages (Jan. 2020).

*Primary Examiner* — Henry Choe
(74) *Attorney, Agent, or Firm* — Sherry W. Gourlay

(57) ABSTRACT

An amplifier includes a semiconductor die and a substrate that is distinct from the semiconductor die. The semiconductor die includes a III-V semiconductor substrate, a first RF signal input terminal, a first RF signal output terminal, and a transistor (e.g., a GaN FET). The transistor has a control terminal electrically coupled to the first RF signal input terminal, and a current-carrying terminal electrically coupled to the first RF signal output terminal. The substrate includes a second RF signal input terminal, a second RF signal output terminal, circuitry coupled between the second RF signal input terminal and the second RF signal output terminal, and an electrostatic discharge (ESD) protection circuit. The amplifier also includes a connection electrically coupled between the ESD protection circuit and the control terminal of the transistor. The substrate may be another semiconductor die (e.g., with a driver transistor and/or impedance matching circuitry) or an integrated passive device.

20 Claims, 8 Drawing Sheets

(51) Int. Cl.
  *H01L 23/60* (2006.01)
  *H01L 23/66* (2006.01)
  *H01L 23/00* (2006.01)
  *H03F 1/02* (2006.01)
  *H03F 1/56* (2006.01)
  *H03F 3/24* (2006.01)

(52) U.S. Cl.
  CPC ............ *H03F 1/0288* (2013.01); *H03F 1/565* (2013.01); *H03F 3/245* (2013.01); *H01L 2223/6655* (2013.01); *H03F 2200/318* (2013.01); *H03F 2200/451* (2013.01)

(58) Field of Classification Search
  USPC .............................. 330/302, 310, 124 R, 295
  See application file for complete search history.

(56) References Cited

U.S. PATENT DOCUMENTS

| | | |
|---|---|---|
| 6,979,869 B2 | 12/2005 | Chen et al. |
| 7,368,768 B2 | 5/2008 | Hayashida |
| 7,733,187 B2 * | 6/2010 | Tateoka ............... H03F 1/56 330/307 |
| 8,242,510 B2 | 8/2012 | Hebert |
| 8,804,290 B2 | 8/2014 | Brodsky |
| 9,082,921 B2 | 7/2015 | Wilcox et al. |
| 9,306,514 B2 | 4/2016 | Kwon et al. |
| 9,425,172 B2 | 8/2016 | van de Ven et al. |
| 10,250,197 B1 | 4/2019 | Schultz et al. |
| 10,418,358 B2 | 9/2019 | Weyers |
| 2003/0164737 A1 * | 9/2003 | Yamamoto ............. H03F 3/60 330/310 |
| 2007/0228475 A1 | 10/2007 | Bordeaux et al. |
| 2012/0081822 A1 | 4/2012 | Woo et al. |
| 2013/0134441 A1 | 5/2013 | Su |
| 2018/0026029 A1 | 1/2018 | Lin et al. |
| 2019/0140598 A1 | 5/2019 | Schultz et al. |

* cited by examiner

POWER AMPLIFIER WITH A POWER TRANSISTOR AND AN ELECTROSTATIC DISCHARGE PROTECTION CIRCUIT ON SEPARATE SUBSTRATES

TECHNICAL FIELD

Embodiments of the subject matter described herein relate generally to power amplifiers and transistors with electrostatic discharge circuitry.

BACKGROUND

Gallium nitride (GaN) field effect transistors (FETs) are increasingly being utilized in high-power amplifier circuits for cellular base stations and other systems to increase efficiency and operating bandwidth. GaN FETs have proven to provide high amplifier performance due to their relatively high power density and relatively high unit current gain frequency, when compared with some of their silicon based counterparts. The higher power density allows for smaller die peripheries for a given level of output power. This may result in lower drain-source capacitance, CDS, and higher output impedances with wider output bandwidth, when compared with silicon devices.

Regardless of the semiconductor technology used (e.g., silicon or GaN), the gate oxides of FET transistors can be damaged by transient electrostatic discharge (ESD) events. Accordingly, ESD protection circuits may be integrated into a power transistor die alongside the FET gate. That said, however, the relatively high wafer costs of GaN make inclusion of additional circuitry on a GaN FET die cost prohibitive, in many cases. Accordingly, ESD circuitry is not typically implemented alongside a GaN FET gate, which leaves the sensitive gate oxide of the GaN FET gate exposed to high potential ESD events that may occur during manufacturing or later, such as when the GaN FET is deployed in the field. Accordingly, what are needed are a method and circuit for protecting a GaN FET gate oxide from ESD events, which considers the high wafer costs of GaN.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. It should be noted that corresponding components (i.e., components with similar or identical characteristics and/or functionality) between the various figures either have identical reference numbers or have the same last two numerical digits (e.g., components 120, 220, 420, 520, 620, 720, and 820, FIGS. 1, 2, and 4-8, are "corresponding components").

DETAILED DESCRIPTION

Figure 1:
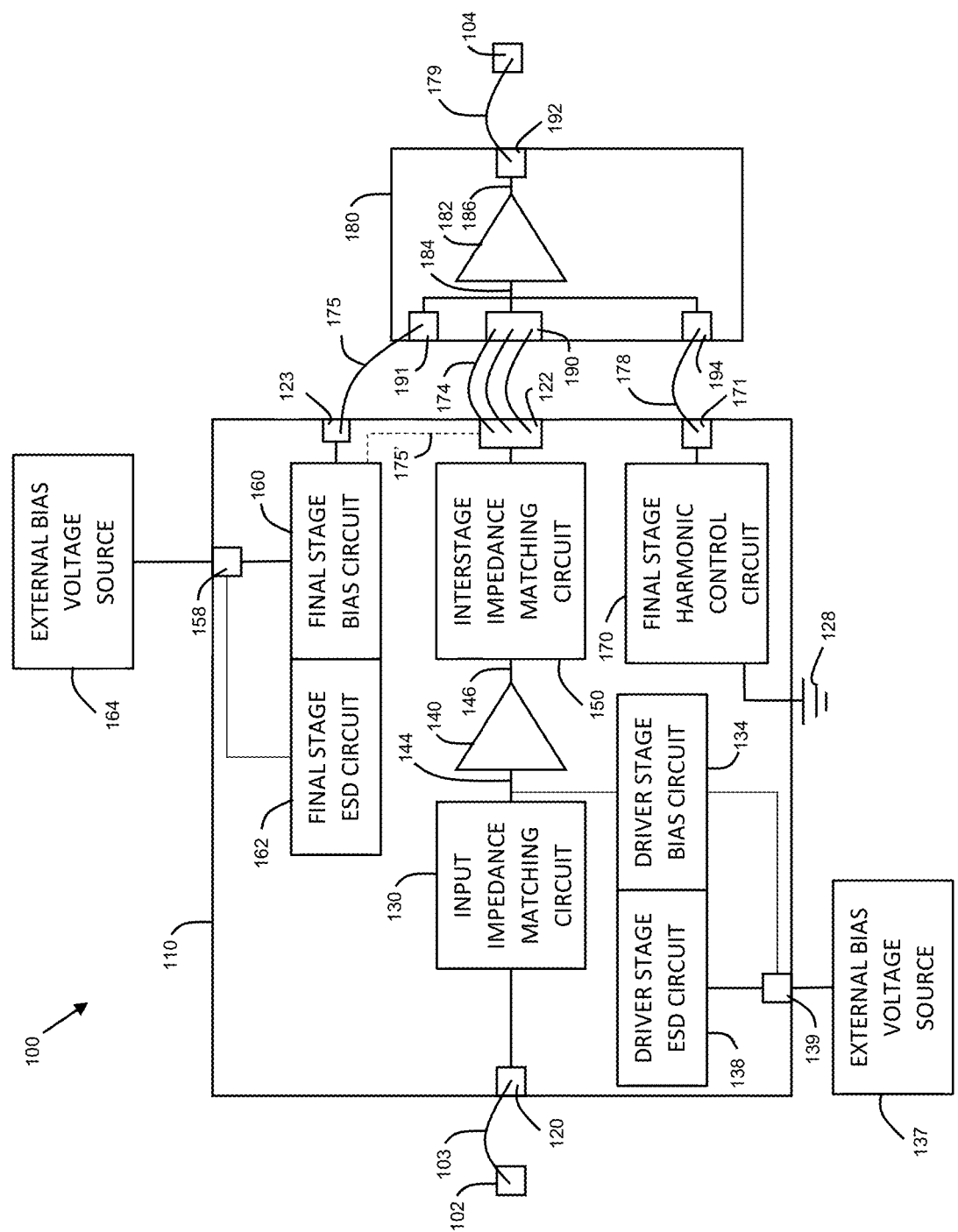
FIG. 1 is a simplified block diagram of a two-stage amplifier with a driver stage die, a final stage die with a gallium nitride (GaN) transistor, and an electrostatic discharge (ESD) circuit for the GaN transistor input on the driver stage die, in accordance with an example embodiment.

Various embodiments of the inventive subject matter include methods and circuits for protecting a gallium nitride (GaN) field effect transistor (FET) gate oxide from electrostatic discharge (ESD) events. The various embodiments specifically include an amplifier that includes a first substrate (e.g., a driver stage die or an integrated passive device (IPD)), an amplifier die with a GaN FET, and an ESD protection circuit on the first substrate configured to protect the GaN FET input from ESD events. The amplifier and ESD protection circuit configurations disclosed herein provide ESD event protection for the GaN FET gate oxide without utilizing valuable GaN die area for the ESD protection circuit. In addition, in some embodiments, the GaN FET is a depletion-mode, normally-on FET that is configured to operate using a negative gate bias voltage, and the ESD protection circuit is configured so as not to disturb the negative gate bias, while clamping high positive ESD potential voltages and shorting ESD energy away from the GaN FET to which the ESD protection circuit is connected.

GaN FETs commonly are depletion-mode, normally-on devices, which utilize a bias voltage control circuit to generate a negative gate voltage to pinch the device off. According to some embodiments that include a GaN die with a depletion-mode GaN FET, the above-mentioned first substrate (e.g., a driver stage die or an IPD) includes an integrated GaN bias voltage control circuit, which is electrically coupled to the GaN die, and which is configured to provide a negative gate voltage to pinch the GaN FET off. More specifically, in such an embodiment, the GaN bias voltage control circuit may be considered to be a GaN negative DC bias circuit (e.g., a direct current-to-direct current (DC-DC) voltage converter configured to convert a first (positive or negative) DC voltage to a negative DC voltage to be used as the GaN bias voltage). As will be described in more detail below, an embodiment of an ESD protection circuit is also included on the first substrate and is coupled to the GaN bias voltage control circuit and to the GaN FET gate. The ESD protection circuit includes a diode and an ESD voltage clamping circuit, according to an embodiment. The diode isolates the ESD voltage clamping circuit from the negative gate bias voltage, but allows high positive voltages associated with ESD events to pass to the ESD voltage clamping circuit, which shunts the ESD energy away from the GaN FET gate. Integration of the GaN bias voltage control circuit and the ESD protection circuit into the first substrate, as opposed to the GaN die, may result in significant cost-reductions considering the lower cost of the first substrate area in comparison to GaN die area.

According to a specific embodiment, a two-stage amplifier includes a GaN FET final stage die connected to a driver stage die of a different semiconductor technology (e.g., silicon, silicon germanium, SOI, SGOI, or other suitable technologies) that includes an ESD protection circuit for the GaN FET gate. For example, in various embodiments, a GaN FET final stage die is connected to a driver stage die that includes a silicon laterally diffused metal oxide semiconductor FET (LDMOS FET) or a driver stage die that includes a stack of silicon or silicon germanium (SiGe) complementary metal oxide semiconductor (CMOS) transistors (e.g., FETs, BJTs, and/or heterojunction bipolar transistors (HBTs)), where the driver stage die also includes an ESD protection circuit for the GaN FET gate. According to yet another specific embodiment, a single-stage amplifier includes a GaN FET die connected to an IPD that includes an ESD protection circuit for the GaN FET gate. These embodiments will be described in more detail below.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

As used herein, the term "transistor" means a field effect transistor (FET), a bipolar junction transistor (BJT), a heterojunction bipolar transistor (HBT), or another type of transistor. For example, a "FET" may be a metal-oxide-semiconductor FET (MOSFET), a laterally-diffused MOSFET (LDMOS FET), an enhancement-mode or depletion-mode high electron mobility transistor (HEMT), or another type of FET. The description below refers to a transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize BJT devices, HBT devices, or other types of transistors.

The term "die" means a single, distinct semiconductor die within which one or more circuit components (e.g., transistors, passive devices, and so on) are integrated and/or directly physically connected. The term "silicon . . . die" (e.g., as in a "silicon driver stage die") means an integrated circuit die that includes one or more silicon-based or SiGe-based power transistors. For example, a "silicon . . . die" is a die that includes a power transistor (e.g., a FET, BJT, HBT, or other type of silicon transistor) formed in and/or on a silicon substrate, a SiGe substrate, a silicon-on-insulator (SOI) substrate, a SiGe-on-insulator (SGOI) substrate, or another suitable silicon-based or SiGe-based substrate. A "silicon transistor" means a transistor in which the primary current-conducting channel is formed primarily from silicon or SiGe semiconductor materials. The term "GaN . . . die" (e.g., as in a "GaN final stage die") mean an integrated circuit die that includes a GaN power transistor. For example, a "GaN . . . die" is a die that includes a GaN power transistor formed in and/or on a GaN substrate, a GaN-on-silicon substrate, a GaN-on-silicon carbide (SiC) substrate, a GaN on aluminum nitride (AlN) substrate, a GaN on sapphire substrate, a GaN on diamond substrate, or another suitable GaN-based hetero-epitaxy and substrate arrangement. A "GaN transistor" or "GaN FET" means a transistor in which the primary current-conducting channel is formed primarily from GaN semiconductor materials.

FIG. 1 is a simplified block diagram of a two-stage amplifier 100 with a silicon driver stage die 110 and a GaN final stage die 180 electrically coupled together in a cascade arrangement between an RF signal input terminal 102 and an RF signal output terminal 104, in accordance with an example embodiment. The driver stage die 110 includes a silicon die input terminal 120, a silicon die output terminal 122, an input impedance matching circuit 130, a silicon transistor 140, an integrated portion of an interstage impedance matching circuit 150, a driver stage bias voltage control circuit 134 ("driver stage bias circuit"), a final stage bias voltage control circuit 160 ("final stage bias circuit"), a driver stage ESD protection circuit 138 ("driver stage ESD circuit"), a final stage ESD protection circuit 162 ("final stage ESD circuit"), and a harmonic control circuit 170 ("final stage harmonic control circuit"), in an embodiment. The final stage bias circuit 160, the final stage ESD protection circuit 162, and the final stage harmonic control circuit 170 may be referred to herein as "secondary circuits" of the driver stage die 110, in that they are integrated with the driver stage die 110, but their functionality is associated with affecting the bias voltage, the ESD protection, or the harmonic control for the GaN transistor 182, respectively, as will be described in more detail later.

Along a forward amplification path, the RF signal input terminal 102 is electrically coupled to the silicon die input terminal 120 through connection 103 (e.g., a wirebond, wirebond array, or other electrical connection), the silicon die input terminal 120 is coupled to an input to the input impedance matching circuit 130, an output of the input impedance matching circuit 130 is coupled to an input 144 (control terminal) of the silicon transistor 140, an output 146 (current-conducting terminal) of the silicon transistor 140 is coupled to an input to the interstage impedance matching circuit 150, and an output of the interstate impedance matching circuit 150 is coupled to the silicon die output terminal 122.

The silicon die output terminal 122 is electrically coupled through a connection 174 (e.g., a wirebond array or other DC-coupled conductive connection) to a GaN die input terminal 190 of the final stage die 180. The connection 174 represents a non-integrated portion of the interstage matching circuit between the output (e.g., drain) of the silicon transistor 140 and the input (e.g., gate) of the GaN transistor 182. More specifically, the connection 174 is positioned at a low input impedance point in the circuit to match the silicon transistor 140 to the GaN transistor 182 final impedance, which has a low gate-source capacitance, Cgs. In one embodiment, connection 174 is an inductive connection, such as a wirebond array. In other embodiments, other types of DC-coupled connections may be implemented. For example, in an alternate embodiment, dies 110, 180 may be flip-chip dies, or may be configured or packaged so that DC bias and RF signals are conveyable through a substrate to which the dies 110, 180 are coupled, rather than being conveyed through wirebonds or other electrical connections that are distinct from the substrate.

The final stage die 180 includes the GaN die input terminal 190, a GaN die output terminal 192, and a GaN transistor 182, in an embodiment. Continuing along the forward amplification path, the GaN die input terminal 190 is coupled to an input 184 (control terminal) of the GaN transistor 182, and an output 186 (current-conducting terminal) of the GaN transistor 182 is coupled to the GaN die output terminal 192. The GaN die output terminal 192 is electrically coupled through connection 179 (e.g., a wirebond array or other electrical connection) to the RF signal output terminal 104.

During operation, an RF signal received through the RF signal input terminal 102 and the silicon die input terminal 120 is conveyed through the input impedance matching circuit 130, which is configured to raise the impedance of amplifier 100 to a higher impedance level (e.g., 50 Ohms or another impedance level) to enhance gain flatness and power transfer across the frequency band. The resulting RF signal is then amplified by the silicon transistor 140 (i.e., the silicon transistor 140 functions as a driver amplifier, which applies a first gain to the RF signal, or "pre-amplifies" the RF signal). For example, the silicon transistor 140 may apply a gain in a range of about 10 decibels (dB) to about 25 dB to the RF signal (e.g., about 20 dB, in some embodiments), although the gain applied by the silicon transistor 140 may be lower or higher, as well. The amplified RF signal produced at the output 146 of the silicon transistor 140 is then conveyed through the integrated portion of the interstage impedance matching circuit 150. The resulting RF signal produced at output terminal 122 is then conveyed through the connection 174 to the GaN die input terminal 190 of the final stage die 180. The integrated portion of the interstage impedance matching circuit 150 and the connection 174 between the die 110, 180 together are configured to match the output impedance (or drain impedance) of silicon transistor 140 with the input impedance of GaN transistor 182 to enhance gain flatness and power transfer across the frequency band. In some embodiments, the connection 174 is a non-integrated, series inductive component in the interstage matching circuit between the output of the silicon amplifier 140 and the input 184 of the GaN amplifier 182.

The pre-amplified RF signal received at the GaN die input terminal 190 is amplified by the GaN transistor 182 (i.e., the GaN transistor 182 functions as a final amplifier, which applies a second gain to the RF signal). For example, the GaN transistor 182 may apply a gain in a range of about 10 dB to about 15 dB to the RF signal (e.g., about 14 dB, in some embodiments), yielding a total gain through the device 100 in a range of about 20 dB to about 40 dB (e.g., about 35 dB, in some embodiments), although the gain applied by the GaN transistor 182 and/or the total device gain may be lower or higher, as well. The amplified RF signal produced at the output 186 of the GaN transistor 182 is then conveyed through the GaN die output terminal 192 and the connection 179 to the RF signal output terminal 104.

As mentioned above, the driver stage die 110 further includes an integrated driver stage bias voltage control circuit 134, which is configured to convey a positive bias voltage to the input 144 (e.g., the gate terminal) of the silicon transistor 140 of the driver stage die 110. Accordingly, the input 144 to the silicon transistor 140 receives a positive DC bias voltage with an RF signal that produces voltage swings above and below the DC bias voltage. The driver stage die 110 more specifically includes a first bias voltage control circuit input terminal 139 (referred to simply as "bias input terminal"), and the driver stage bias circuit 134 electrically coupled between the bias input terminal 139 and the gate of the silicon transistor 140. The driver stage bias circuit 134 is a DC-DC converter circuit, in an embodiment. In various embodiments, the driver stage bias circuit 134 may be configured to: 1) convert a positive DC bias voltage into another positive DC bias voltage at a different voltage level; or 2) convert a negative DC bias voltage into a positive DC bias voltage. The bias input terminal 139 is configured to receive a bias voltage from external bias circuit (e.g., an external voltage source 137, which produces a DC bias voltage, +VDD or −VDD) through the bias input terminal 139, and the driver stage bias circuit 139 performs a DC-DC conversion of the received bias voltage to produce a driver stage gate bias voltage, which is provided to the gate of the silicon transistor 140 of the driver stage die 110. According to an embodiment, the silicon transistor 140 is configured to operate using a positive DC bias voltage. During operation, a bias voltage received from the external bias voltage source 137 by the integrated bias voltage control circuit 134 through the bias input terminal 139 is conditioned (e.g., filtered) by circuit 134 and conveyed to the input 144 of the silicon transistor 140.

According to an embodiment, the driver stage die 110 further includes an integrated final stage bias voltage control circuit 160, which is configured to convey a negative bias voltage to the input 184 (e.g., the gate terminal) of the GaN transistor 182 of the final stage die 180. Accordingly, the input 184 to the GaN transistor 182 receives a negative DC bias voltage with an RF signal that produces voltage swings above and below the DC bias voltage. The driver stage die 110 more specifically includes a bias voltage control circuit input terminal 158 (referred to simply as "bias input terminal"), and the final stage bias circuit 160 electrically coupled between the bias input terminal 158 and a bias output terminal 123. The final stage bias circuit 160 is a DC-DC converter circuit, in an embodiment. In various embodiments, the final stage bias circuit 160 may be configured to: 1) convert a positive DC bias voltage into a negative DC bias voltage; or 2) convert a negative DC bias voltage into another negative DC bias voltage at a different voltage level. The bias input terminal 158 is configured to receive a bias voltage from external bias circuit (e.g., an external voltage source 164, which produces a DC bias voltage, +VDD or −VDD) through the bias input terminal 158, and the final stage bias circuit 160 performs a DC-DC conversion of the received bias voltage to produce a final stage gate bias voltage, which is provided to the gate of the GaN transistor 182 of the final stage die 180. According to an embodiment, the GaN transistor 182 is a depletion-mode, normally-on device, and the received and conveyed bias voltage is a negative DC bias voltage that functions to pinch off the GaN transistor 182.

According to an embodiment, the final stage bias circuit 160 is coupled to the gate of the GaN transistor 182 through a bias output terminal 123 of the driver stage die 110, connection 175 (e.g., one or more wirebonds or other conductive connections), and a bias input terminal 191 of the final stage die 180. According to another embodiment, and as indicated with the dashed-line connector 175' between final stage bias circuit 160 and output terminal 122, rather than coupling the final stage bias circuit 160 to the GaN transistor 182 through the bias output terminal 123, connection 175, and bias input terminal 191, the final stage bias circuit 160 may alternatively be coupled to the GaN transistor 182 through connection 175', output terminal 122, connection 174 (e.g., one or more wirebonds or other conductive connections), and the input terminal 190 of the final stage die 180.

The final stage bias circuit 160 and the connection 175 (or 175' plus 174) together are configured to filter the DC bias voltage, and to produce the resulting bias voltage signal at the input terminal 191 (or 190). The input terminal 191 (or 190), in turn, is electrically coupled to the input 184 (e.g., the gate terminal) of the GaN transistor 182. During operation, a bias voltage received from the external bias voltage source 164 by the final stage bias circuit 160 through the bias input terminal 158 is conditioned (e.g., filtered) by circuit 160 and conveyed to the input 184 of the GaN transistor 182 through the output terminal 123 (or 122) of the driver stage die 110, connection 175 (or 175' plus 174), and the bias input terminal 191 (or 190) of the final stage die 180.

According to a further embodiment, the driver stage die 110 further includes integrated first and second ESD protection circuits 138, 162 ("driver stage ESD circuit" and "final stage ESD circuit," respectively). The driver stage ESD circuit 138 is coupled to bias input terminal 139, driver stage bias circuit 134, and the input 144 (e.g., gate terminal) of the silicon transistor 140. The driver stage ESD circuit 138 is configured to provide ESD event protection for the gate oxide of the silicon FET 140. Conversely, the final stage ESD circuit 162 is coupled to bias input terminal 158, final stage bias circuit 160, and the input 184 (e.g., gate terminal) of the GaN transistor 182.

The driver stage ESD circuit 138 is configured to provide ESD event protection for the gate oxide of the silicon transistor 140. More specifically, the driver stage ESD circuit 138 is configured to "turn on" to shunt energy away from the input 144 of the silicon transistor 140 when sufficiently positive or negative voltage conditions occur. Similarly, the final stage ESD circuit 162 is configured to provide ESD event protection for the gate oxide of the GaN transistor 182. More specifically, the final stage ESD circuit 162 is configured to "turn on" to shunt energy away from the input 184 of the GaN transistor 182 when sufficiently positive or negative voltage conditions occur. Example circuit configurations of the driver stage and final stage ESD circuits 138, 162 will be discussed in more detail later in conjunction with FIGS. 2 and 3. Importantly, however, and according to an embodiment, the driver stage and final stage ESD circuits 138, 162 are differently configured, in that the final stage ESD circuit 162 includes at least one additional component (e.g., diode 266, FIG. 2) that is included to avoid disturbing (e.g., shunting) the negative gate bias provided to the GaN transistor 182. Because a positive gate bias is provided to the silicon transistor 140, the additional component(s) in the final stage ESD circuit 162 need not be included in the driver stage ESD circuit 138.

As indicated in FIG. 1, the final stage ESD protection circuit 162 is implemented on the driver stage die 110. It should be noted that including the final stage ESD circuit 162 on the driver stage die 110 is particularly advantageous, in that it provides ESD event protection for the gate oxide of the GaN FET 182 without utilizing valuable area on the final stage die 180.

According to a further embodiment, the driver stage die 110 further includes an integrated harmonic control circuit 170 (or "final stage harmonic control circuit") configured to provide a low-impedance path to an external ground reference 128 for signals at one or more harmonic frequencies (e.g., a second harmonic frequency ($2f_0$), a third harmonic frequency ($3f_0$), and so on) of the fundamental frequency ($f_0$) at which the amplifier 100 is configured to operate. More specifically, the driver stage die 110 includes a harmonic control circuit input terminal 171 and the integrated harmonic control circuit 170 electrically coupled between harmonic control circuit input terminal 171 and the external ground reference 128. The harmonic control circuit input terminal 171 is electrically coupled through connection 178 (e.g., one or more wirebonds or other conductive connections) to a harmonic signal output terminal 194 of the final stage die 180. The harmonic signal output terminal 194, in turn, is electrically coupled to the input terminal 184 (e.g., the gate terminal) of the GaN transistor 182. During operation, signal energy produced at the input terminal 184 of the GaN transistor 182 at one or more harmonic frequencies is conveyed from the harmonic signal output terminal 194 through connection 178 to the harmonic control circuit input terminal 171, and the final stage harmonic control circuit 170 functions to shunt the harmonic frequency signal energy to the external ground reference 128.

The device 100 of FIG. 1 may have several advantages over conventional devices. Conceptually, the driver stage die 110 functions to buffer the input to the final stage die 180. More specifically, utilization of the driver stage die 110 isolates the dynamic input of the final stage die 180, which may make the device 100 better suited for broadband applications. In addition, the interaction between the driver stage die 110 and the final stage die 180 may enable better shaping of the AM/PM and AM/AM responses. Further, the driver stage die 110 may provide proper input harmonic loading for GaN wave shaping. Further still, various embodiments of driver stage dies 110 may be offered as standard options that can be flexibly mated with a variety of high-performing final stage dies 180, thus enabling more rapid introduction of two-stage devices into the market.

Figure 2:
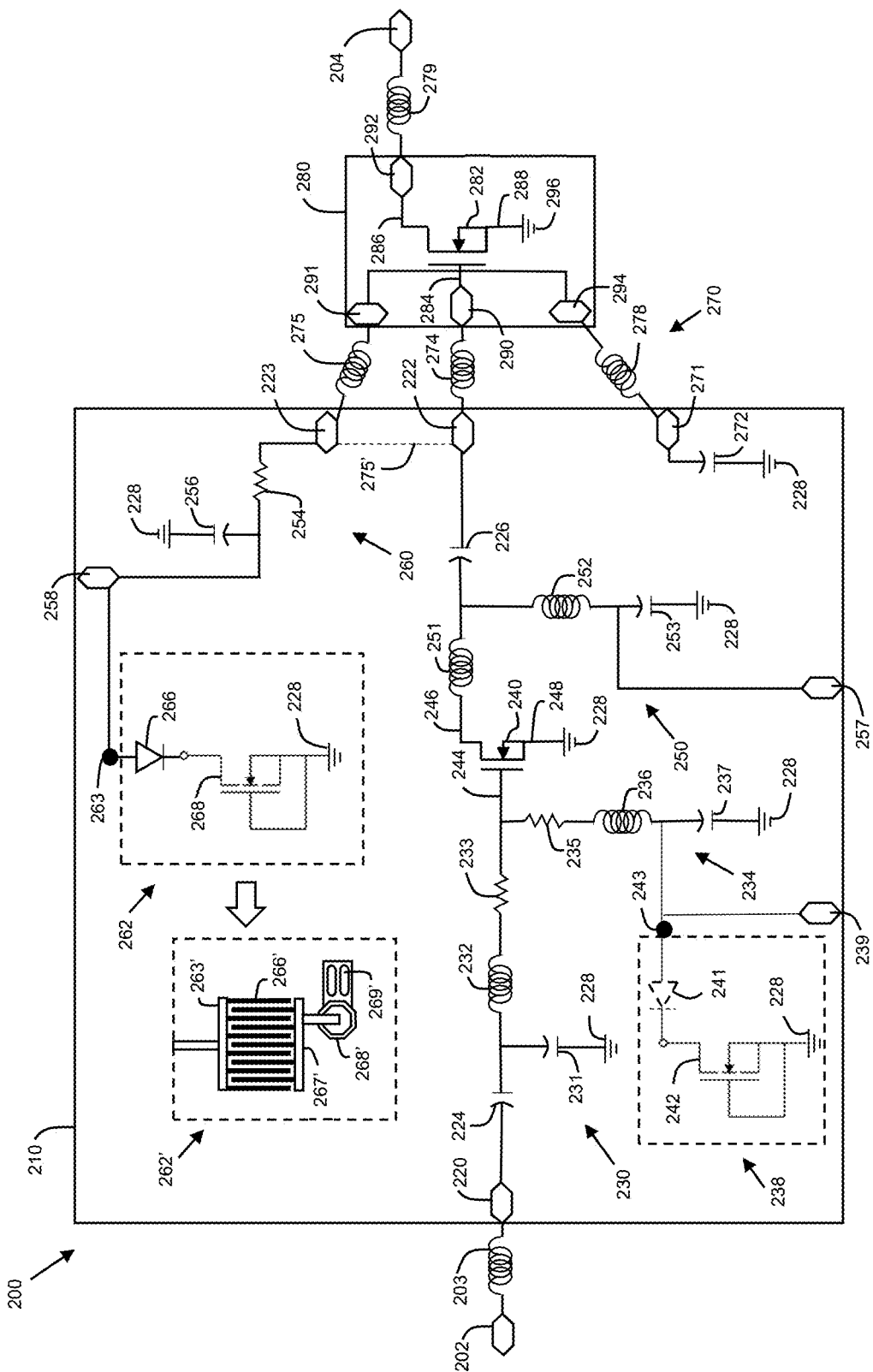
FIG. 2 is a circuit diagram of a two-stage, cascade amplifier with a driver stage die, a final stage die with a GaN transistor, and an ESD circuit on the driver stage die for the GaN transistor input, in accordance with an example embodiment.

A circuit diagram that includes a depiction of a more specific embodiment of amplifier 100 will now be described in more detail in conjunction with FIG. 2. More specifically, FIG. 2 is a circuit diagram illustrating a two-stage, cascade amplifier 200 with a silicon driver stage and a GaN final stage, in accordance with an example embodiment. Amplifier 200 includes a silicon driver stage die 210 (e.g., silicon die 110, FIG. 1) and a GaN final stage die 280 (e.g., GaN die 180, FIG. 1), which are electrically coupled together in a cascade arrangement between an RF signal input terminal 202 (e.g., input terminal 102, FIG. 1) and an RF signal output terminal 204 (e.g., output terminal 104, FIG. 1). A plurality of circuits, each including an arrangement of passive and/or active electrical components, are integrated within the driver stage die 210 and the final stage die 280.

In the below description of the driver stage die 210 and the final stage die 280, reference will be made to various circuits that include capacitors, inductors, and/or resistors. The capacitors may be, for example, integrated metal-insulator-metal (MIM) capacitors formed within the build-up layers, and/or small chip capacitors (discrete capacitors) coupled to the top surface of the die, in various embodiments. The resistors may be, for example, integrated resistors (e.g., formed from polysilicon), or small discrete resistors coupled to the top surface of the die. The inductors may be integrated spiral inductors or may be discrete inductors or inductances formed from wirebonds or other inductive components.

The driver stage die 210 includes a plurality of circuits integrated within a silicon die. In an embodiment, the integrated circuitry of die 210 includes an input terminal 220

(e.g., input terminal 120, FIG. 1), an output terminal 222 (e.g., output terminal 122, FIG. 1), a first DC blocking/AC decoupling capacitor 224, a second DC blocking/AC decoupling capacitor 226, an input impedance matching circuit 230 (e.g., circuit 130, FIG. 1), a power transistor 240 (e.g., transistor 140, FIG. 1), an integrated portion of an interstage impedance matching circuit 250 (e.g., circuit 150, FIG. 1), a first bias voltage control circuit 234 (e.g., circuit 134, FIG. 1), a second bias voltage control circuit 260 (e.g., circuit 160, FIG. 1), a driver stage ESD circuit 238 (e.g., circuit 138, FIG. 1), a final stage ESD circuit 262 (e.g., circuit 162, FIG. 1), and an integrated portion of a harmonic control circuit 270 (e.g., circuit 170, FIG. 1), in an embodiment.

The driver stage die 210 includes a silicon substrate (e.g., including silicon, SOI, SiGe, and SGOI substrates) and a plurality of build-up layers over a top surface of the silicon substrate. The plurality of build-up layers may include, for example, a plurality of interleaved dielectric layers and patterned conductive layers. Portions of different patterned conductive layers are electrically coupled with conductive vias. Further, conductive through substrate vias (TSVs) (e.g., via 269') may provide conductive paths between the top and bottom surfaces of the silicon substrate. According to an embodiment, a conductive layer on the bottom surface of the silicon substrate functions as a ground node for the die 210 (e.g., corresponding to ground node 228, FIG. 2). Although not shown in FIG. 2, the conductive layer may be physically and electrically coupled to a ground node of a separate substrate to which the die 210 is attached, as described later.

The power transistor 240 is the primary amplification component of the driver stage die 210. In an embodiment, power transistor 240 includes a silicon FET with an input/gate terminal 244 (control terminal), a drain terminal 246 (first current-conducting terminal), and a source terminal 248 (second current conducting terminal). The source terminal 248 is electrically coupled to a ground node 228 (e.g., the source terminal 248 is electrically coupled to a conductive layer on a bottom surface of the silicon die 210 through one or more through substrate vias (TSVs)).

The RF signal input terminal 202 is electrically coupled to the input terminal 220 of the driver stage die 210 with a connection 203 (e.g., a plurality of wirebonds or another electrical connection). The first DC blocking/AC decoupling capacitor 224 has a first terminal electrically coupled to the input terminal 220, and a second terminal electrically coupled to the input impedance matching circuit 230. The first DC blocking/AC decoupling capacitor 224 may provide some impedance transformation, but with a primary functionality of blocking the driver stage gate bias voltage, Vg1 (e.g., up to about 3.2 volts or more) from being conveyed to the input terminal 220.

The input impedance matching circuit 230 is electrically coupled between the second terminal of the DC blocking/AC decoupling capacitor 224 and the input/gate terminal 244 of the power transistor 240. The input impedance matching circuit 230 includes the first DC blocking/AC decoupling capacitor 224, a second capacitor 231, a first inductor 232, a first resistor 233, and a shunt circuit that includes components of the first bias voltage control circuit 234. More specifically, these components include a series combination of a second resistor 235, a second inductor 236, and a third capacitor 237.

The second capacitor 231 includes a first terminal coupled to the second terminal of the DC blocking/AC decoupling capacitor 224, and a second terminal coupled to the ground node 228. The first inductor 232 includes a first terminal coupled to the second terminal of the DC blocking/AC decoupling capacitor 224 (and to the first terminal of capacitor 231), and a second terminal coupled to the input/gate terminal 244 of the power transistor 240 through the first resistor 233. The shunt circuit includes the second resistor 235, the second inductor 236, and the third capacitor 237 (e.g., a DC blocking capacitor) electrically coupled in series between the input/gate terminal 244 of the power transistor 240 and the ground node 228. In alternate embodiments, the order of the second resistor 235, the second inductor 236, and the third capacitor 237 may be different from the order depicted in FIG. 2.

The input impedance matching circuit 230 functions to raise the impedance of amplifier 200, and also to impart amplitude and phase distortions on the RF signal that are inverse to the amplitude and phase distortions imparted by the GaN transistor 282 of the final stage die 280. In some embodiments, the input impedance matching circuit 230 (by itself or in conjunction with the interstage impedance matching circuit 250) may be characterized by a positive loss slope that complements the negative gain slopes of transistors 240, 282 to create a flat RF gain response. The input impedance matching circuit 230 may include a low pass circuit, a high pass circuit, a bandpass circuit, or a combination thereof, in various embodiments. Although the input impedance matching circuit 230 is shown in FIG. 2 to have a particular configuration, in other embodiments, the input impedance matching circuit 230 may be differently configured, while still performing substantially the same functions.

A positive gate bias voltage, Vg1, for the power transistor 240 is provided by driver stage bias circuit 234 (e.g., driver stage bias circuit 134, FIG. 1) to the input/gate terminal 244 of the power transistor 240 through the shunt circuit of the input impedance matching circuit 230, in an embodiment. More particularly, the gate bias voltage may be provided through an input terminal 239 (e.g., terminal 139, FIG. 1), which is electrically coupled to a node of the shunt circuit (e.g., a node between the second inductor 236 and the third capacitor 237). For example, the gate bias voltage may be provided by an external voltage source and may have a value up to about 3.2 volts or more, although the gate bias voltage may be lower or higher, as well.

According to an embodiment, the driver stage ESD circuit 238 is coupled to bias input terminal 239, driver stage bias circuit 234, and the input/gate terminal 244 of the silicon transistor 240. The driver stage ESD circuit 238 is configured to provide ESD event protection for the gate oxide of the silicon FET 240.

According to an embodiment, the driver stage ESD circuit 238 includes an ESD clamp coupled between bias input terminal 239 and ground 228 (i.e., coupled between bias input terminal 239 and the input/gate terminal 244 of transistor 240). More specifically, the driver stage ESD circuit 238 includes an ESD circuit input 243 and an ESD transistor 242, both of which are integrated into the driver stage die 210. The ESD transistor 242 is configured to shunt energy associated with the ESD events to ground 228, and thus away from the input/gate terminal 244 of the silicon transistor 240. It should be noted that, at the input/gate terminal 244 of transistor 240, voltages resulting from the combination of the positive bias voltage received through bias input terminal 239 and the RF signal applied to the input/gate terminal 244 of transistor 240 may result in both positive and negative voltage swings at the input/gate terminal 244, where negative voltage excursions occur when the magnitude of the RF signal exceeds the bias voltage. However, the LC feed (comprising inductor 236 and capacitor 237) is configured to isolate the driver stage ESD circuit 238 from voltage swings associated with the RF signal.

According to another embodiment, the driver stage ESD circuit 238 also may include a diode 241 (indicated to be optional by depicting diode 241 with dashed lines) coupled in series with the ESD transistor 242. More specifically, the diode 241, when included, has an anode coupled to the ESD circuit input 243, and a cathode coupled to the drain of ESD transistor 242. Essentially, diode 241 isolates the ESD transistor 242 from negative voltages occurring at ESD circuit input 243 (i.e., voltages resulting from the combination of the bias voltage received through bias input terminal 239 and the RF signal applied to the input/gate terminal 244 of transistor 240, when the LC feed is not adequate to isolate RF signal voltage swings), while passing energy associated with high positive voltages (e.g., ESD events) to the ESD transistor 242.

The ESD transistor 242 can be any suitable device for performing an ESD function, and in one embodiment, the ESD transistor 242 may be a grounded gate (gg) n-channel MOSFET ("ggNMOSFET") with a common source/body. More specifically, the gate, source, and substrate terminals of ESD transistor 242 are grounded (e.g., coupled to ground node 228), and the drain terminal is coupled through diode 241, when included, and ESD circuit input 243 to bias input terminal 239, driver stage bias circuit 234, and the input/gate terminal 244 of the silicon transistor 240.

The basic functionality of the driver stage ESD circuit 238 is similar to the functionality of the final stage ESD circuit 262, although there may be some differences in circuit topology, component characteristics, and/or functionality. For example, in some embodiments, the driver stage ESD circuit 238 may not include diode 241, whereas the final stage ESD circuit 262 does include diode 266. Because the final stage ESD circuit 262 is more relevant to the important features of the present invention, the operation of ESD circuits 238 and 262 will be described in detail later, in conjunction with the description of the final stage bias circuit 260.

On the output side of transistor 240, the integrated portion of the interstage impedance matching circuit 250 is electrically coupled between the drain terminal 246 of the power transistor 240, and the output terminal 222. The integrated portion of the interstage impedance matching circuit 250 includes a first inductor 251, a shunt circuit, and the second DC blocking/AC decoupling capacitor 226. The first inductor 251 includes a first terminal coupled to the drain terminal 246 of the power transistor 240, and a second terminal coupled to a first terminal of the second DC blocking/AC decoupling capacitor 226. The shunt circuit includes a series combination of a second inductor 252 and a first capacitor 253 (e.g., a DC blocking capacitor) electrically coupled between the second terminal of the first inductor 251 (and the first terminal of the second DC blocking/AC decoupling capacitor 226) and the ground node 228.

The interstage impedance matching circuit 250, coupled with connection 274, function to match the impedance of the drain terminal 246 of power transistor 240 to the input/gate terminal 284 of transistor 282 for proper power transfer across the frequency band. In addition, the interstage impedance matching circuit 250 functions to shape the input RF waveforms to the final stage die 280. As indicated above, the interstage impedance matching circuit 240 (by itself or in conjunction with the input impedance matching circuit 230) may be characterized by a positive loss slope that complements the negative gain slopes of transistors 140, 182 to create a flat RF gain response. For example, when the transistors 140, 182 are characterized by a roll off of X dB per octave (e.g., 6 dB per octave or some other value), the input and/or interstage impedance matching circuits 230, 250 may be designed to have a positive slope of X dB per octave (e.g., 6 dB per octave or some other value). This produces a complimentary gain response and may present an overall flatter gain.

The interstage impedance matching circuit 250 (plus connection 274) may include a low pass circuit, a high pass circuit, a bandpass circuit, or a combination thereof, in various embodiments. Although the interstage impedance matching circuit 250 is shown in FIG. 2 to have a particular configuration, in other embodiments, the interstage impedance matching circuit 250 may be differently configured, while still performing substantially the same functions.

The second DC blocking/AC decoupling capacitor 226 may provide some impedance transformation, but with a primary functionality of blocking a drain bias voltage, Vd1 from a gate bias voltage, Vg2, for the power transistor 282 of the final stage die 280. The drain bias voltage, Vd1, for the power transistor 240 is provided to the drain terminal 246 of the power transistor 240 through the shunt circuit of the interstage impedance matching circuit 250, in an embodiment. More particularly, the drain bias voltage may be provided through an input terminal 257, which is electrically coupled to a node of the shunt circuit (e.g., a node between the second inductor 252 and the first capacitor 253). For example, the drain bias voltage may be provided by an external voltage source and may have a value in a range of about 3 volts to about 48 volts, although the drain bias voltage may be lower or higher, as well. Thus, at least a portion of the first shunt circuit functions as a driver stage bias control circuit, or more specifically as a driver stage drain bias voltage control circuit.

According to an embodiment, the gate bias voltage, Vg2, for the power transistor 282 of the final stage die 280 is provided through bias circuitry that is integrated in the driver stage die 210. More specifically, a portion of the final stage bias circuit 260 that is integrated in driver stage die 210 includes a bias input terminal 258 (e.g., terminal 158, FIG. 1), resistor 254, and a bias output terminal 223 (e.g., terminal 123, FIG. 1), in an embodiment. A non-integrated portion of the final stage bias circuit 260 includes connector 275 (e.g., connector 175, FIG. 1) and bias input terminal 291 (e.g., terminal 191, FIG. 1). Bias input terminal 291, in turn, is electrically coupled to the input/gate terminal 284 of the power transistor 282 of the final stage die 280. During operation, a negative DC voltage may be provided through the input terminal 258 (e.g., by an external voltage source, such as source 164, FIG. 1). The gate bias voltage circuit 260 then converts the received voltage into a negative DC gate bias voltage, Vg2, for the GaN transistor 282. For example, the gate bias voltage may have a value between about −5 volts and about −2 volts, although the gate bias voltage may be lower or higher, as well.

Notably, the gate bias voltage control circuit 260 (or "final stage bias circuit") for the gate bias voltage, Vg2, for the power transistor 282 of the final stage die 280 is integrated into the driver stage die 210. Including the gate bias voltage control circuit 260 in the driver stage die 210, rather than in the final stage die 280, may yield significant cost savings due to the significantly lower cost of silicon die area versus GaN die area.

According to an embodiment, the final stage ESD circuit 262 is coupled to bias input terminal 258, final stage bias circuit 260, and the input/gate terminal 284 of the GaN transistor 282. The final stage ESD circuit 262 is configured to provide ESD event protection for the gate oxide of the GaN transistor 282. According to an embodiment, the final stage ESD circuit 262 includes a diode coupled in series with an ESD clamp between bias input terminal 258 and ground 228. More specifically, the final stage ESD circuit 262 includes an ESD circuit input 263, a diode 266, and an ESD transistor 268, all of which are integrated into the driver stage die 210.

Essentially, diode 266 isolates the ESD transistor 268 from negative voltages provided at ESD circuit input 263 (i.e., voltages resulting from the combination of the bias voltage received through bias input terminal 258 and the RF signal applied to the input/gate terminal 284 of transistor 282), while passing energy associated with high positive voltages (e.g., ESD events) to the ESD transistor 268. The ESD transistor 268, in turn, shunts energy associated with the ESD events to ground 228, and thus away from the input/gate terminal 284 of the GaN transistor 282. Essentially, the diode 266 is selected so that relatively small magnitude-Vgs conditions on the input/gate terminal 284 of the GaN transistor 282 do not cause diode 266 to conduct current, thus isolating the ESD transistor 268 from such voltages. However, current can be conducted through the diode 266 when positive voltages are present at the ESD circuit input 263. ESD events that have positive voltages that may be sufficient to damage the gate oxide (at input/gate terminal 284) of the GaN transistor 282 are conveyed through diode 266 to the ESD transistor 268, and the ESD transistor 268 begins conducting, thus shunting the energy associated with such ESD events away from the GaN transistor 282. Diode 266 is isolated from the body of the semiconductor of driver stage die 210, in an embodiment, and thus may be referred to as an "isolated diode."

Diode 266 is coupled in series with ESD transistor 268 between ESD circuit input 263 and ground node 228. More particularly, the anode of diode 266 is coupled to the input/gate terminal 284 of GaN transistor 282 through resistor 254, bias output terminal 223 (e.g., terminal 123, FIG. 1), connection 275 (e.g., connection 175, FIG. 1), and bias input terminal 291 (e.g., terminal 191, FIG. 1). Alternatively, the anode of diode 266 may be coupled to input/gate terminal 284 of GaN transistor 282 through resistor 254, connection 275' (e.g., connection 175', FIG. 1), output terminal 222 (e.g., terminal 122, FIG. 1), connection 274 (e.g., connection 174, FIG. 1), and input terminal 290 (e.g., terminal 190, FIG. 1). The cathode of diode 266 is coupled to the drain terminal of ESD transistor 268.

Diode 266 has an inherent resistance, which is determined according to a desired performance of the ESD circuit 262 (e.g., to a given breakdown condition of the diode 266). According to an embodiment, diode 266 is configured to have a breakdown voltage in a range of about -5 volts to about -10 volts, although the breakdown voltage may be lower or higher, as well.

According to an embodiment, the ESD transistor 268 may be a ggNMOSFET, or another suitable transistor configuration. More specifically, the gate, source, and substrate terminals of ESD transistor 268 are grounded (e.g., coupled to ground node 228), and the drain terminal is coupled through diode 266 to bias input terminal 258, final stage bias circuit 260, and the input/gate terminal 284 of the GaN transistor 282. During an ESD event, when diode 266 is conducting current and the drain voltage of ESD transistor 268 increases, the drain-substrate junction of ESD transistor 268 is reverse biased. Under sufficiently high voltage, avalanche breakdown occurs, and the source-substrate junction is forward biased, resulting in the drain current being shunted to the ground node 228 and away from the final stage bias circuit 260 and the input/gate terminal 284 of the GaN transistor 282. Although a particular type of ESD transistor 268 is depicted in FIG. 2 and described above, in various embodiments, the ESD transistor 268 can be any suitable device for performing an ESD function.

An example depiction of a top view of a layout of an integrated final stage ESD circuit 262 is shown in box 262' of FIG. 2. According to an embodiment, diode 266 may be implemented as a P-N junction polysilicon diode 266' that is integrally formed in the driver stage die 210 (e.g., the P-N junction polysilicon diode is formed at least partially from a polysilicon layer of a silicon substrate). More specifically, an embodiment of diode 266' includes a plurality of elongated p-type semiconductor regions coupled through overlying elongated contacts to an anode manifold/terminal 263', and a plurality of n-type semiconductor regions coupled through overlying elongated contacts to a cathode manifold/terminal 267', where the p-type and n-type semiconductor regions (and their associated contacts) are interleaved. The anode manifold/terminal 263' corresponds to the ESD circuit input 263, and the cathode manifold/terminal 267' is coupled to the drain of ESD transistor 268'.

As depicted in FIG. 2, in some embodiments, ESD transistor 268' may be, for example, an enclosed-layout transistor with an inner diffusion (e.g., drain region) surrounded by a transistor gate and an outer diffusion (e.g., source region). The cathode manifold/terminal 267' is coupled to the inner diffusion (e.g., drain region), and the outer diffusion (e.g., source region) may be coupled with through substrate vias 269' to a ground plane (not shown) on the bottom of the driver stage die 210. In other embodiments, ESD transistor 268, 268' may have other configurations.

Figure 3:
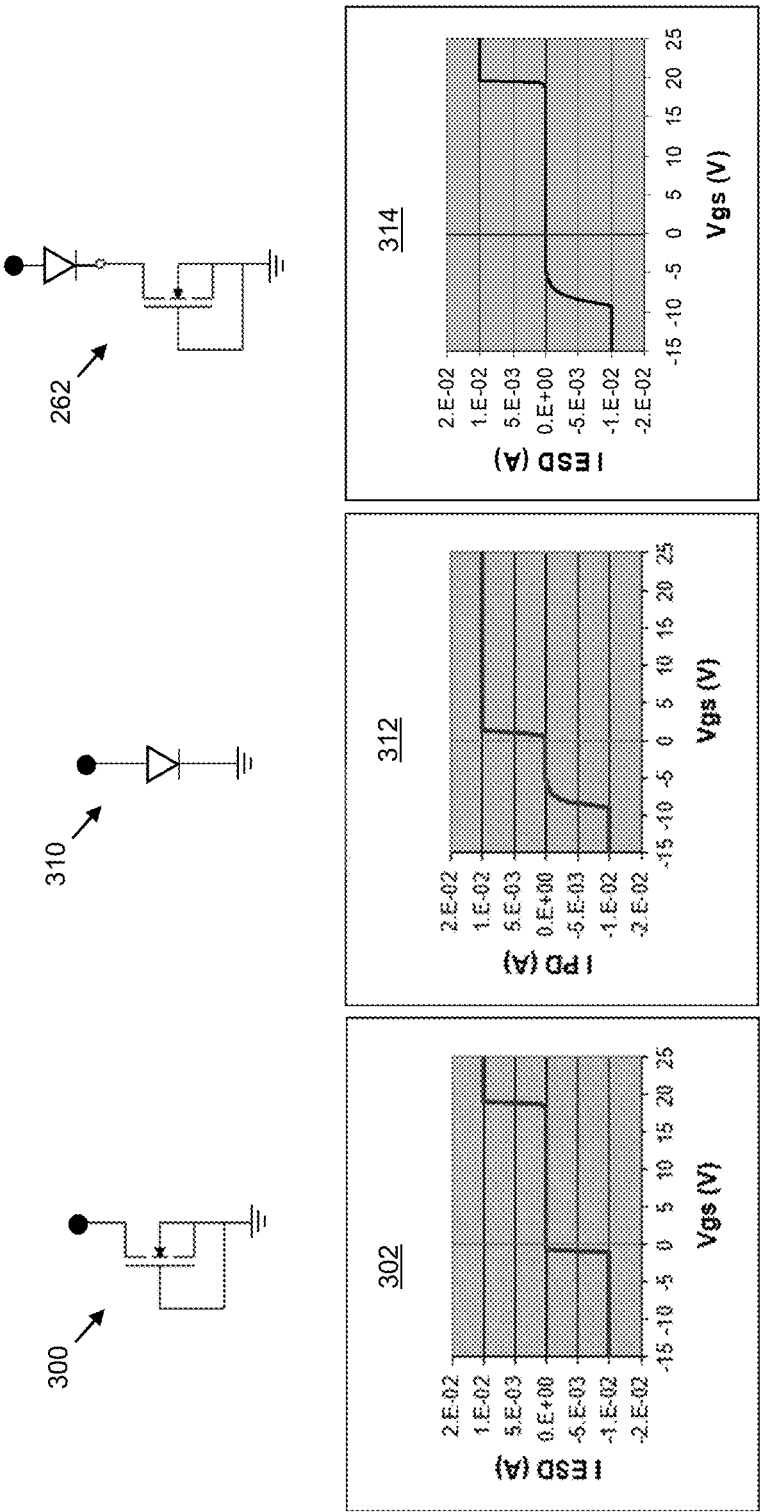
FIG. 3 is a chart illustrating the current versus voltage response of the ESD circuit of FIG. 2, in accordance with an example embodiment.

The current versus voltage responses of a transistor-only ESD circuit 300, a poly-diode circuit 310, and an example of ESD circuit 262 are depicted in charts 302, 312, 314, respectively, of FIG. 3. In each chart 302, 312, 314, the horizontal axis represents the magnitude of voltages across the terminals of the circuit 300, 310, 262, and the vertical axis represents the magnitude of current conducted through the circuit 300, 310, 262.

Referring first to the operation of transistor-only ESD circuit 300 and chart 302, transistor-only ESD circuit 300 is essentially non-conductive for voltages in a range between about 0 volts and about 18 volts (i.e., the breakdown voltage of the transistor), and transistor-only ESD circuit 300 rapidly turns on (i.e., conducts current) for negative voltages and voltages above about 18 volts. Accordingly, while transistor-only ESD circuit 300 provides good protection for relatively high positive voltages, the circuit 300 is unsuitable for applications in which relatively small negative voltages (e.g., negative bias voltages for transistor 282, FIG. 2) should not turn on the ESD circuit.

Referring now to the operation of poly-diode circuit 310 and chart 312, poly-diode circuit 310 is essentially non-conductive for voltages in a range between about -5 volts (i.e., the breakdown voltage of the poly-diode) and about 0 volts, and poly-diode circuit 310 begins to turn on (i.e., conducts current) for positive voltages and for negative voltages below about -5 volts.

Referring now to the operation of ESD circuit 262 and chart 314, which combines the operation of circuits 300, 310, the poly-diode 266 controls operation of ESD circuit 262 in accordance with chart 312 for negative voltages, and ESD transistor 268 controls operation of ESD circuit 262 in accordance with chart 310 for positive voltages. Accordingly, ESD circuit 262 is essentially non-conductive for voltages in a range between about −5 volts and about 18 volts, and is turned on (i.e., conducting current) for voltages below and above this range. Accordingly, ESD circuit 262 may remain non-conductive when negative bias voltages (e.g., bias voltages in a range between about −5 volts and about −2 volts) are present at the ESD circuit input 263, even when modulated by an RF signal that swings below and above the negative bias voltage.

Once again, including the final stage ESD circuit 262 in the driver stage die 210, rather than in the final stage die 280, may yield significant cost savings due to the significantly lower cost of silicon die area versus GaN die area.

It should be noted at this point that, according to an embodiment, ESD circuits 262 and 238 may be differently configured from each other, at least in that the breakdown voltages of diodes 241 and 266 may be different to account for a positive bias voltage provided to the input/gate terminal 244 of silicon transistor 240 and a negative bias voltage provided to the input/gate 284 of GaN transistor 282. Accordingly, although the circuit topologies of ESD circuits 238, 262 may appear to be similar or identical, the different breakdown voltages of the diodes may result in ESD circuit 262 beginning to conduct current at a significantly more negative voltage (at ESD input 263) than the negative voltage (at ESD input 243) at which ESD circuit 238 begins to conduct current. For example, ESD circuit 262 may begin to conduct current at a voltage of at least 3 volts more negative than the voltage at which ESD circuit 238 begins to conduct current (e.g., current conduction could begin at −5 volts for ESD circuit 238, whereas current conduction could begin at −2 volts for ESD circuit 241).

As indicated above, the driver stage die 210 also may include an integrated portion of a harmonic control circuit 270 (or "final stage harmonic control circuit"), which is electrically coupled to the input/gate terminal 284 of the power transistor 282 of the final stage die 280. More specifically, an integrated portion of a harmonic control circuit 270 includes an input terminal 271, and a capacitor 272, which is electrically coupled between the input terminal 271 and the ground node 228, in an embodiment. The input terminal 271 is electrically coupled, via connection 278, to terminal 294 of the final stage die 280. Terminal 294, in turn, is electrically coupled to the input/gate terminal 284 of the power transistor 282 of the final stage die 280. In some embodiments, connection 278 is an inductive connection (e.g., a wirebond, wirebond array, or other inductive connection), and together, the serial combination of the connection 278 and the capacitor 272 provide a low impedance path to the ground node 228 for signal energy at the second harmonic, $2f_0$, of the center operating frequency, $f_0$, of the amplifier 200. Again, including a portion of the harmonic control circuit 270 in the driver stage die 210, rather than in the final stage die 280, may yield significant cost savings due to the significantly lower cost of silicon die area versus GaN die area.

As stated above, the driver stage die 210 (e.g., silicon die 110, FIG. 1) is electrically coupled to the final stage die 280 (e.g., GaN die 180, FIG. 1). In an embodiment, the driver stage die 210 is electrically coupled to the final stage die 280 through connection 274 between the output terminal 222 of the driver stage die 210 and an input terminal 290 of the final stage die 280. For example, the connection 274 may include an inductive connection, such as a wirebond array, or may include another type of DC-coupled connection (e.g., including a microstrip line, a printed coil, a parallel-coupled resistor/capacitor circuit, and so on). The connection 274 provides a non-integrated portion of the interstage impedance matching circuit 250.

The final stage die 280 includes a GaN substrate and a plurality of build-up layers over a top surface of the GaN substrate. The plurality of build-up layers may include, for example, a plurality of interleaved dielectric layers and patterned conductive layers. Portions of different patterned conductive layers are electrically coupled with conductive vias. Further, conductive TSVs may provide conductive paths between the top and bottom surfaces of the GaN substrate. According to an embodiment, a conductive layer on the bottom surface of the GaN substrate functions as a ground node for the die 280 (e.g., corresponding to ground node 296, FIG. 2). Although not shown in FIG. 2, the conductive layer may be physically and electrically coupled to a ground node of a separate substrate to which the die 280 is attached, as described later.

The final stage die 280 includes various circuitry integrated within the final stage die 280. In an embodiment, the integrated circuitry of die 280 includes an input terminal 290 (e.g., input terminal 190, FIG. 1), an output terminal 292 (e.g., output terminal 192, FIG. 1), and a power transistor 282 (e.g., transistor 182, FIG. 1), in an embodiment.

The power transistor 282 is the primary amplification component of the final stage die 280. In an embodiment, power transistor 282 includes a FET with an input/gate terminal 284 (control terminal), a drain terminal 286 (first current-conducting terminal), and a source terminal 288 (second current conducting terminal). The input terminal 290 is coupled to the input/gate terminal 284 of the GaN transistor 282. The drain terminal 286 of the GaN transistor 282 is coupled to the output terminal 292, and the source terminal 288 of the GaN transistor 282 is electrically coupled to a ground node 296 (e.g., the source terminal 288 is electrically coupled to a conductive layer on a bottom surface of the final stage die 280 through one or more TSVs). The output terminal 292 is electrically coupled through a connection 279 (e.g., a wirebond array or other electrical connection) to the RF signal output terminal 204 of the amplifier 200.

Figure 4:
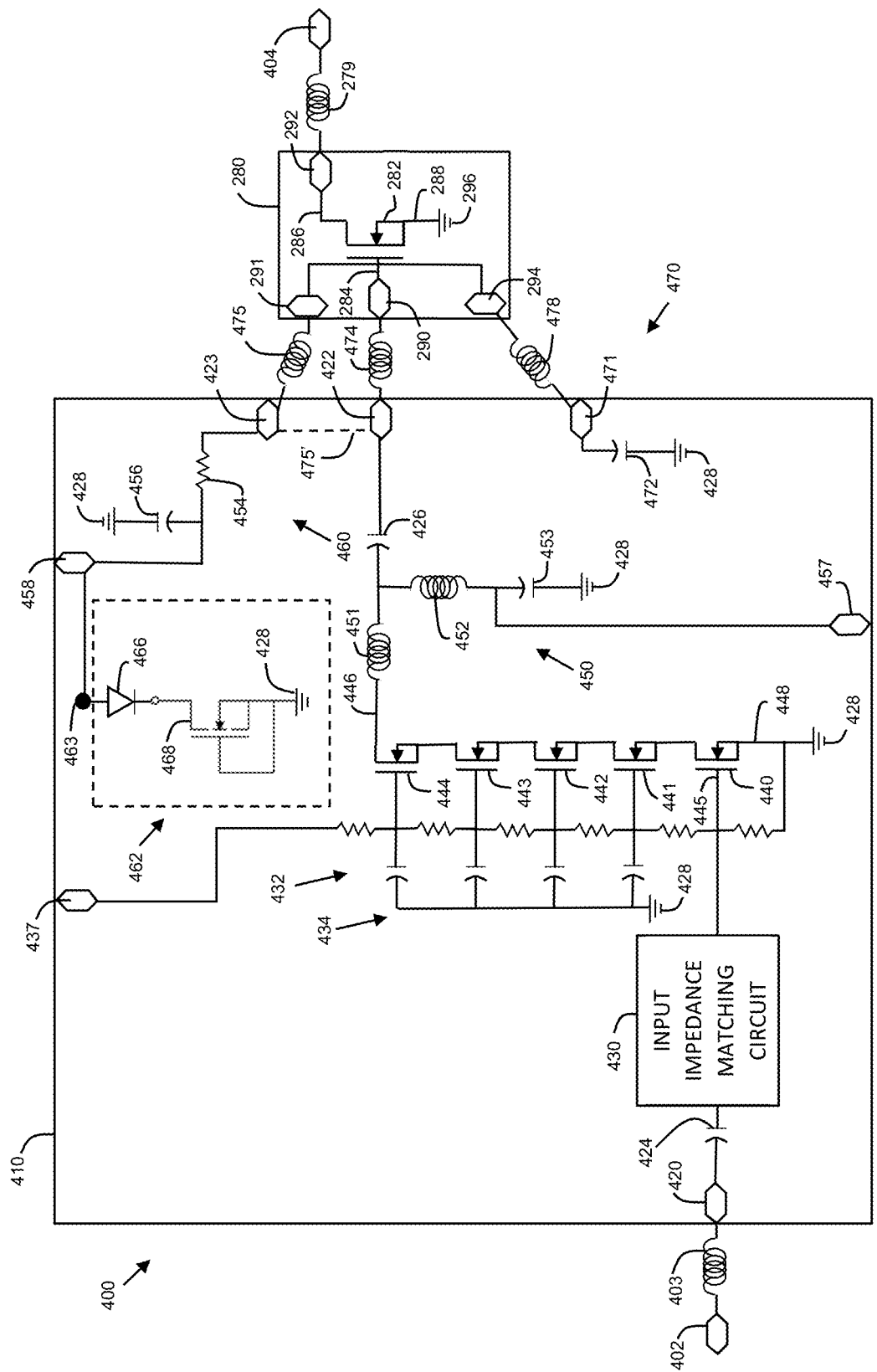
FIG. 4 is a circuit diagram of a two-stage, cascade amplifier with a silicon cascode driver stage die, a final stage die with a GaN transistor, and an ESD circuit on the driver stage die for the GaN transistor input, in accordance with an example embodiment.

An alternate embodiment of a multiple-stage amplifier is depicted in FIG. 4, which is a circuit diagram of a two-stage, cascade amplifier 400 with a cascode stack driver stage and a GaN final stage, in accordance with an example embodiment. More specifically, amplifier 400 includes a silicon driver stage die 410 (e.g., driver stage die 110, FIG. 1) and a GaN final stage die 280 (e.g., final stage die 180, FIG. 1) electrically coupled together in a cascade arrangement. A plurality of circuits, each including an arrangement of passive and/or active electrical components, are integrated within the driver stage die 410 and the final stage die 280.

In the embodiment of FIG. 4, a number of the integrated circuit components may be similar or identical to corresponding components of the embodiment of FIG. 2. For example, in FIG. 4, the GaN final stage die 280 of FIG. 4 may be substantially similar to the GaN final stage die 280 of FIG. 2. In addition, in the silicon driver stage die 410, the input and interstage impedance matching circuits 430, 450 may be substantially similar to the input and interstage impedance matching circuits 230, 250 of the amplifier 200 of FIG. 2. For purpose of brevity, many of the components and circuits of FIG. 4 that have similar counterparts in the embodiment of FIG. 2 are not discussed in detail below. The details of corresponding components discussed above in conjunction with FIG. 2 are intended to apply also to the corresponding components discussed below in conjunction with FIG. 4.

Referring now to FIG. 4, the driver stage die 410 includes a plurality of circuits integrated within a silicon die. In an embodiment, the integrated circuitry of die 410 includes an input terminal 420 (e.g., input terminal 120, FIG. 1), an output terminal 422 (e.g., output terminal 122, FIG. 1), a first DC block/AC decoupling capacitor 424, a second DC block/AC decoupling capacitor 426, an input impedance matching circuit 430 (e.g., circuit 130, FIG. 1), a plurality of power transistors 440, 441, 442, 443, 444 coupled together in a cascode stack arrangement, an integrated portion of an interstage impedance matching circuit 450 (e.g., circuit 150, FIG. 1), a final stage bias voltage control circuit 460 (e.g., circuit 160, FIG. 1), a final stage ESD circuit 462 (e.g., circuit 162, FIG. 1), and an integrated portion of a harmonic control circuit 470 (e.g., circuit 170, FIG. 1), in an embodiment. Although not shown in FIG. 4, die 410 also may include a driver stage ESD circuit (e.g., circuit 138, FIG. 1).

The RF signal input terminal 402 is electrically coupled to the input terminal 420 of the driver stage die 410 with a connection 403 (e.g., a plurality of wirebonds or another electrical connection). The first DC block/AC decoupling capacitor 424 has a first terminal electrically coupled to the input terminal 420, and a second terminal electrically coupled to the input impedance matching circuit 430. The first DC block/AC decoupling capacitor 424 may provide some impedance transformation, but with a primary functionality of blocking the gate bias voltage, Vg1, from the input terminal 420.

The input impedance matching circuit 430 is electrically coupled between the second terminal of the DC block/AC decoupling capacitor 424 and the gate terminal 445 of the power transistor 440. In FIG. 4, the input impedance matching circuit 430 is depicted as a block. In various embodiments, the input impedance matching circuit 430 may have a structure that is similar or identical to the structure of the embodiments of input impedance matching circuit 230 (FIG. 2), which was described in detail above. For purpose of brevity, the details of input impedance matching circuit 430 are not depicted in FIG. 4 or described in detail. The details of input impedance matching circuit 230 discussed above in conjunction with FIG. 2 are intended to apply also to the input impedance matching circuit 430 of FIG. 4.

The cascode stack of power transistors 440-444 is the primary amplification component of the driver stage die 410. Although a cascode stack consisting of five transistors is illustrated in FIG. 4, other embodiments may include fewer or more transistors connected in a cascode stack arrangement (e.g., from 2 to 10 transistors or more). Further, other embodiments may include different cascode topologies from the topology depicted in FIG. 4.

In an embodiment, each of the power transistors 440-444 includes a CMOS FET with a gate terminal (e.g., gate terminal 445), a drain terminal (e.g., drain terminal 446), and a source terminal (e.g., source terminal 448). The gate terminal 445 of the lowest transistor 440 in the stack is electrically coupled to the input impedance matching circuit 430. The source terminal 448 of the lowest transistor 440 in the stack is electrically coupled to a ground node 428 (e.g., the source terminal 448 is electrically coupled to a conductive layer on a bottom surface of the final stage die 410 through one or more TSVs). Proceeding from the lowest transistor 440 in the stack to the highest transistor 444 in the stack, the drain terminal of each lower transistor 440-443 is electrically coupled to the source terminal of each adjacent higher transistor 441-444, as illustrated in FIG. 4. The drain terminal 446 of the highest transistor 444 in the stack is electrically coupled to the output terminal 422, as described in more detail below. Essentially, the transistors 440-444 of the driver stage die 410 are connected together as a CMOS cascode stack, in an embodiment. In some embodiments, the driver stage die 410 is implemented using a silicon substrate, an SOI substrate, a SiGe substrate, or a SGOI substrate, although die 410 may be implemented using other types of substrates, in other embodiments.

Gate bias voltages, Vg1, for the power transistors 440-444 are provided to the gate terminals of the power transistors 440-444 through a voltage ladder network 432, in an embodiment. More particularly, a gate bias voltage may be provided through an input terminal 437, which is electrically coupled to the voltage ladder network 432. Through the voltage ladder network 432, consecutively higher gate bias voltages may be provided from the lowest transistor 440 up through the highest transistor 444. For example, the gate bias voltage may be provided to terminal 437 by an external voltage source and may have a value in a range of about 3 volts to about 10 volts, although the gate bias voltage may be lower or higher, as well. According to an embodiment, AC components of the gate bias voltages may be bypassed to the ground node 428 through a capacitor network 434. In alternate embodiments, the capacitor network 434 may be excluded from the circuit.

The integrated portion of the interstage impedance matching circuit 450 is electrically coupled between the drain terminal 446 of the highest power transistor 444, and the output terminal 422. The integrated portion of the interstage impedance matching circuit 450 includes a first inductor 451, a shunt circuit, and the second DC blocking/AC decoupling capacitor 426. The first inductor 451 includes a first terminal coupled to the drain terminal 446 of the power transistor 444, and a second terminal coupled to a first terminal of the second DC block/AC decoupling capacitor 426. The shunt circuit includes a series combination of a second inductor 452 and a first capacitor 453 (e.g., a DC blocking capacitor) electrically coupled between the second terminal of the first inductor 451 (and the first terminal of the second DC block/AC decoupling capacitor 426) and the ground node 428.

The second DC block/AC decoupling capacitor 426 may provide some impedance transformation, but with a primary functionality of blocking a drain bias voltage, Vd1 from a gate bias voltage, Vg2, for the power transistor 282 of the GaN final stage die 280. The drain bias voltage, Vd1, for the power transistor 444 is provided to the drain terminal 446 of the power transistor 444 through the shunt circuit of the interstage impedance matching circuit 450, in an embodiment. More particularly, the drain bias voltage may be provided through an input terminal 457, which is electrically coupled to a node of the shunt circuit (e.g., a node between the second inductor 452 and the first capacitor 453. For example, the drain bias voltage may be provided by an external voltage source, and may have a value of about 3 volts, although the drain bias voltage may be lower or higher, as well.

According to an embodiment, the gate bias voltage, Vg2, for the power transistor 282 of the final stage die 280 is provided through bias circuitry that is integrated in the driver stage die 410. More specifically, a portion of the final stage bias circuit 460 that is integrated in driver stage die 410 includes a bias input terminal 458 (e.g., terminal 158, FIG. 1), resistor 454, and a bias output terminal 423 (e.g., terminal 123, FIG. 1), in an embodiment. A non-integrated portion of the final stage bias circuit 460 includes connector 475 (e.g., connector 175, FIG. 1) and bias input terminal 291 (e.g., terminal 191, FIG. 1). Bias input terminal 291, in turn, is electrically coupled to the input/gate terminal 284 of the power transistor 282 of the final stage die 280. Alternatively, the bias input terminal 458 may be coupled to the input/gate terminal 284 of the power transistor 282 through resistor 454, connection 475' (e.g., connection 175', FIG. 1), output terminal 422 (e.g., terminal 122, FIG. 1), connection 474 (e.g., connection 174, FIG. 1), and input terminal 290 (e.g., terminal 190, FIG. 1). Either way, during operation, a negative DC voltage may be provided through the input terminal 458 (e.g., by an external voltage source, such as source 164, FIG. 1). The gate bias voltage circuit 460 then converts the received voltage into a negative DC gate bias voltage, Vg2, for the GaN transistor 282. For example, the gate bias voltage may have a value between about −5 volts and about −2 volts, although the gate bias voltage may be lower or higher, as well.

Notably, the gate bias voltage control circuit 460 (or "final stage bias circuit") for the gate bias voltage, Vg2, for the power transistor 282 of the final stage die 280 is integrated into the driver stage die 410. Including the gate bias voltage control circuit 460 in the driver stage die 410, rather than in the final stage die 280, may yield significant cost savings due to the significantly lower cost of silicon die area versus GaN die area.

According to an embodiment, the final stage ESD circuit 462 is coupled to bias input terminal 458, final stage bias circuit 460, and the input/gate terminal 284 of the GaN transistor 282. The final stage ESD circuit 462 is configured to provide ESD event protection for the gate oxide of the GaN transistor 282. According to an embodiment, the final stage ESD circuit 462 includes a forward-biased diode coupled in series with an ESD clamp between bias input terminal 458 and ground 428. More specifically, the final stage ESD circuit 462 includes an ESD circuit input 463, a diode 466, and an ESD transistor 468, all of which are integrated into the driver stage die 410. The functionality and components of the final stage ESD circuit 462 are substantially similar to or identical to the functionality and components of the final stage ESD circuit 262 (FIG. 2). To avoid repetition, the details of the functionality and components of the final stage ESD circuit 262 are incorporated into this description of the final stage ESD circuit 462.

As indicated above, the driver stage die 410 also may include an integrated portion of a harmonic control circuit 470 (or "final stage harmonic control circuit"), which is electrically coupled to the gate terminal 284 of the power transistor 282 of the GaN final stage die 280. More specifically, an integrated portion of a harmonic control circuit 470 includes an input terminal 471, and a capacitor 472, which is electrically coupled between the input terminal 471 and the ground node 428, in an embodiment. The input terminal 471 is electrically coupled, via connection 478, to terminal 294 of the GaN final stage die 280. Terminal 294, in turn, is electrically coupled to the gate terminal 284 of the power transistor 282 of the GaN final stage die 280. In some embodiments, connection 478 is an inductive connection (e.g., a wirebond, wirebond array, or other inductive connection), and together, the serial combination of the connection 478 and the capacitor 472 provide a low impedance path to the ground node 428 for signal energy at the second harmonic, $2f_0$, of the center operating frequency, $f_0$, of the amplifier 400. Again, including a portion of the harmonic control circuit 470 in the driver stage die 410, rather than in the GaN final stage die 280, may yield significant cost savings.

As with the amplifier embodiment of FIG. 2, the driver stage die 410 (e.g., silicon die 110, FIG. 1) is electrically coupled to the final stage die 280 (e.g., GaN die 180, FIG. 1). In an embodiment, the driver stage die 410 is electrically coupled to the final stage die 280 through connection 474 between the output terminal 422 of the driver stage die 410 and an input terminal 290 of the final stage die 280. For example, the connection 474 may include an inductive connection such as a wirebond array or may include another type of DC-coupled connection. As with the previously-described embodiment, the connection 474 may function to provide a non-integrated portion of the interstage impedance matching circuit 450.

The GaN final stage die 280 of FIG. 4 may be identical or substantially similar to the GaN final stage die 280 of FIG. 2. For purposes of brevity, the details of the GaN final stage die 280 of FIG. 2 are not repeated here. The details of the GaN final stage die 280 discussed above in conjunction with FIG. 2 are intended to apply also to the GaN final stage die 280 of FIG. 4.

The above-described embodiments each include a two-stage amplifier with a first amplification stage implemented on a first die, and a second amplification stage implemented on a second die. The inventive subject matter also may be implemented in a single-stage amplifier, or in an amplifier with more than two stages.

Figure 5:
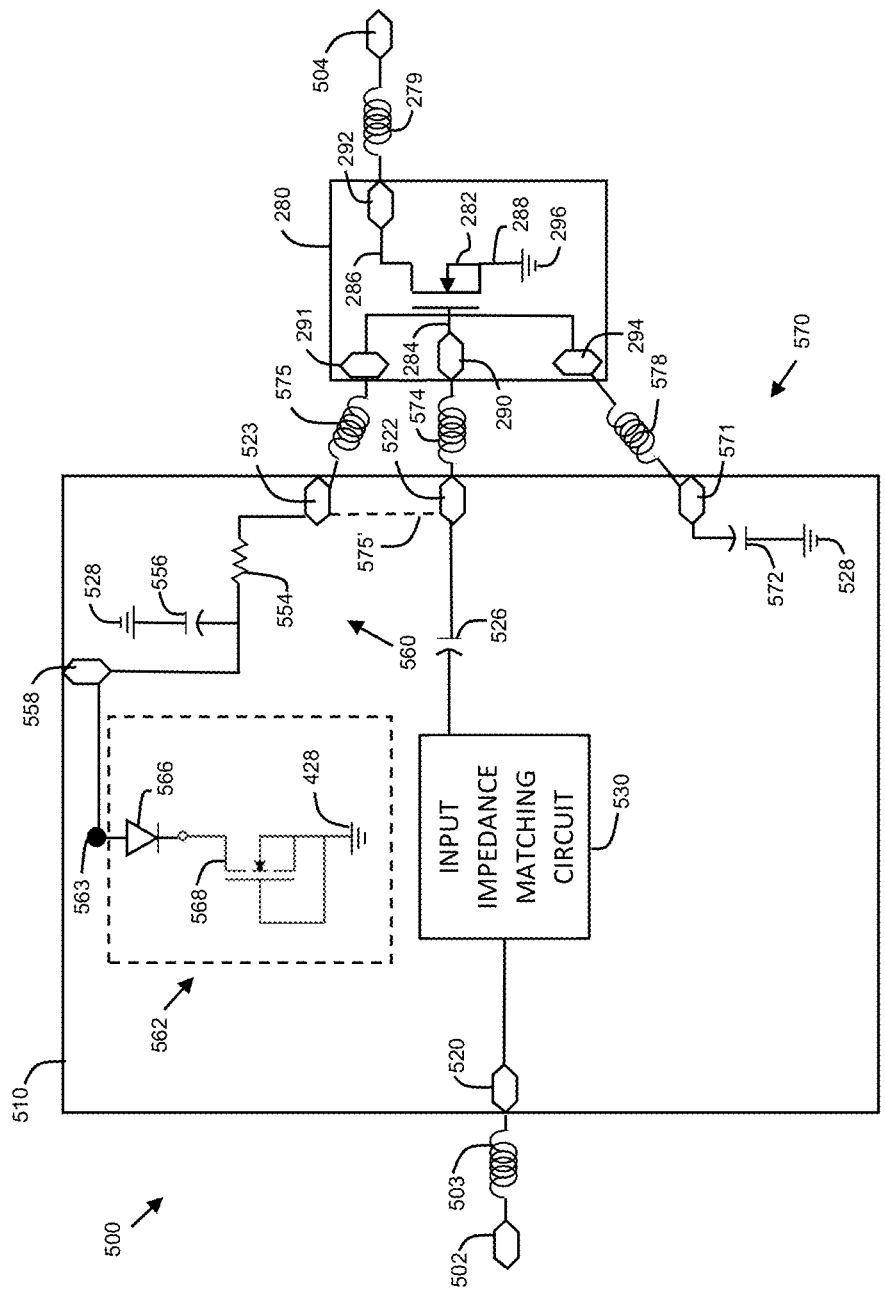
FIG. 5 is a circuit diagram of a single-stage amplifier with an input circuit implemented on an integrated passive device (IPD), an amplifier die with a GaN transistor, and an ESD circuit for the GaN transistor input on the IPD, in accordance with an example embodiment.

For example, FIG. 5 is a circuit diagram of a single-stage amplifier 500 with an input circuit implemented on an integrated passive device (IPD) 510, an amplifier die 280 with a GaN transistor 282, and an ESD circuit 562 for the GaN transistor input on the IPD 510, in accordance with an example embodiment. More specifically, amplifier 500 includes an IPD 510 and a GaN amplifier die 280 electrically coupled together in a series arrangement. A plurality of circuits, each including an arrangement of passive and/or active electrical components, are integrated within the IPD 510 and the amplifier die 280.

In the embodiment of FIG. 5, a number of the integrated circuit components may be similar or identical to corresponding components of the embodiment of FIG. 2. For example, in FIG. 5, the GaN amplifier die 280 may be substantially similar to the GaN amplifier die 280 of FIG. 2. For purpose of brevity, many of the components and circuits of FIG. 5 that have similar counterparts in the embodiment of FIG. 2 are not discussed in detail below. The details of corresponding components discussed above in conjunction with FIG. 2 are intended to apply also to the corresponding components discussed below in conjunction with FIG. 5.

Referring now to FIG. 5, the IPD 510 includes a plurality of circuits integrated within and/or coupled to a semiconductor substrate (e.g., a silicon, SOI, SiGe, SGOI, gallium arsenide (GaAs), or another suitable semiconductor substrate). In an embodiment, the integrated circuitry of IPD 510 includes an input terminal 520, an output terminal 522, an input impedance matching circuit 530, a DC block/AC decoupling capacitor 526, an amplifier bias voltage control circuit 560, an ESD circuit 562, and an integrated portion of a harmonic control circuit 570, in an embodiment.

An RF signal input terminal 502 is electrically coupled to the input terminal 520 of the IPD 510 with a connection 503 (e.g., a plurality of wirebonds or another electrical connection). The input impedance matching circuit 530 is electrically coupled between the input terminal 520 and the DC block/AC decoupling capacitor 526. In FIG. 5, the input impedance matching circuit 530 is depicted as a block. In various embodiments, the input impedance matching circuit 530 may have a structure that is similar or identical to the structure of the embodiments of input impedance matching circuit 230 (FIG. 2), which was described in detail above. For purpose of brevity, the details of input impedance matching circuit 530 are not depicted in FIG. 5 or described in detail. The details of input impedance matching circuit 230 discussed above in conjunction with FIG. 2 are intended to apply also to the input impedance matching circuit 530 of FIG. 5.

The DC block/AC decoupling capacitor 526 has a first terminal electrically coupled to the input impedance matching circuit 530, and a second terminal electrically coupled to the output terminal 522. The DC block/AC decoupling capacitor 526 may provide some impedance transformation, but with a primary functionality of blocking the gate bias voltage, Vg, for the GaN transistor 282 from the input terminal 520.

According to an embodiment, the gate bias voltage, Vg, for the power transistor 282 of the amplifier die 280 is provided through bias circuitry that is integrated in the IPD 510. More specifically, a portion of the amplifier bias circuit 560 that is integrated in IPD 510 includes a bias input terminal 558, resistor 554, and a bias output terminal 523, in an embodiment. A non-integrated portion of the amplifier bias circuit 560 includes connector 575 and bias input terminal 291 (e.g., terminal 191, FIG. 1). Bias input terminal 291, in turn, is electrically coupled to the input/gate terminal 284 of the power transistor 282 of the amplifier die 280. Alternatively, the bias input terminal 558 may be coupled to the input/gate terminal 284 of the power transistor 282 through resistor 554, connection 575', output terminal 522, connection 574, and input terminal 290. Either way, during operation, a negative DC voltage may be provided through the input terminal 558 (e.g., by an external voltage source, such as source 164, FIG. 1). The gate bias voltage circuit 560 then converts the received voltage into a negative DC gate bias voltage, Vg, for the GaN transistor 282. For example, the gate bias voltage may have a value between about $-5$ volts and about $-2$ volts, although the gate bias voltage may be lower or higher, as well.

Notably, the gate bias voltage control circuit 560 (or "amplifier bias circuit") for the gate bias voltage, Vg, for the power transistor 282 of the amplifier die 280 is integrated into the IPD 510. Including the gate bias voltage control circuit 560 in the IPD 510, rather than in the amplifier die 280, may yield significant cost savings due to the significantly lower cost of IPD die area versus GaN die area.

According to an embodiment, the amplifier ESD circuit 562 is coupled to bias input terminal 558, amplifier bias circuit 560, and the input/gate terminal 284 of the GaN transistor 282. The amplifier ESD circuit 562 is configured to provide ESD event protection for the gate oxide of the GaN transistor 282. According to an embodiment, the amplifier ESD circuit 562 includes a forward-biased diode coupled in series with an ESD clamp between bias input terminal 558 and ground 528. More specifically, the amplifier ESD circuit 562 includes an ESD circuit input 563, a diode 566, and an ESD transistor 568, all of which are integrated into or onto the IPD 510. The functionality and components of the amplifier ESD circuit 562 are substantially similar to or identical to the functionality and components of the amplifier ESD circuit 262 (FIG. 2). To avoid repetition, the details of the functionality and components of the amplifier ESD circuit 262 are incorporated into this description of the amplifier ESD circuit 562.

The IPD 510 also may include an integrated portion of a harmonic control circuit 570 (or "amplifier harmonic control circuit"), which is electrically coupled to the gate terminal 284 of the power transistor 282 of the GaN amplifier die 280. More specifically, an integrated portion of a harmonic control circuit 570 includes an input terminal 571, and a capacitor 572, which is electrically coupled between the input terminal 571 and the ground node 528, in an embodiment. The input terminal 571 is electrically coupled, via connection 578, to terminal 294 of the GaN amplifier die 280. Terminal 294, in turn, is electrically coupled to the gate terminal 284 of the power transistor 282 of the GaN amplifier die 280. In some embodiments, connection 578 is an inductive connection (e.g., a wirebond, wirebond array, or other inductive connection), and together, the serial combination of the connection 578 and the capacitor 572 provide a low impedance path to the ground node 528 for signal energy at the second harmonic, $2f_0$, of the center operating frequency, $f_0$, of the amplifier 500. Again, including a portion of the harmonic control circuit 570 in the IPD 510, rather than in the GaN amplifier die 280, may yield significant cost savings.

As with the amplifier embodiment of FIG. 2, the IPD 510 is electrically coupled to the amplifier die 280 (e.g., GaN die 180, FIG. 1). In an embodiment, the IPD 510 is electrically coupled to the amplifier die 280 through connection 574 between the output terminal 522 of the IPD 510 and an input terminal 290 of the amplifier die 280. For example, the connection 574 may include an inductive connection such as a wirebond array or may include another type of DC-coupled connection. The connection 574 may function to provide a non-integrated portion of the input impedance matching circuit 530.

The GaN amplifier die 280 of FIG. 5 may be identical or substantially similar to the GaN amplifier die 280 of FIG. 2. For purposes of brevity, the details of the GaN amplifier die 280 of FIG. 2 are not repeated here. The details of the GaN amplifier die 280 discussed above in conjunction with FIG. 2 are intended to apply also to the GaN amplifier die 280 of FIG. 5.

Figure 6:
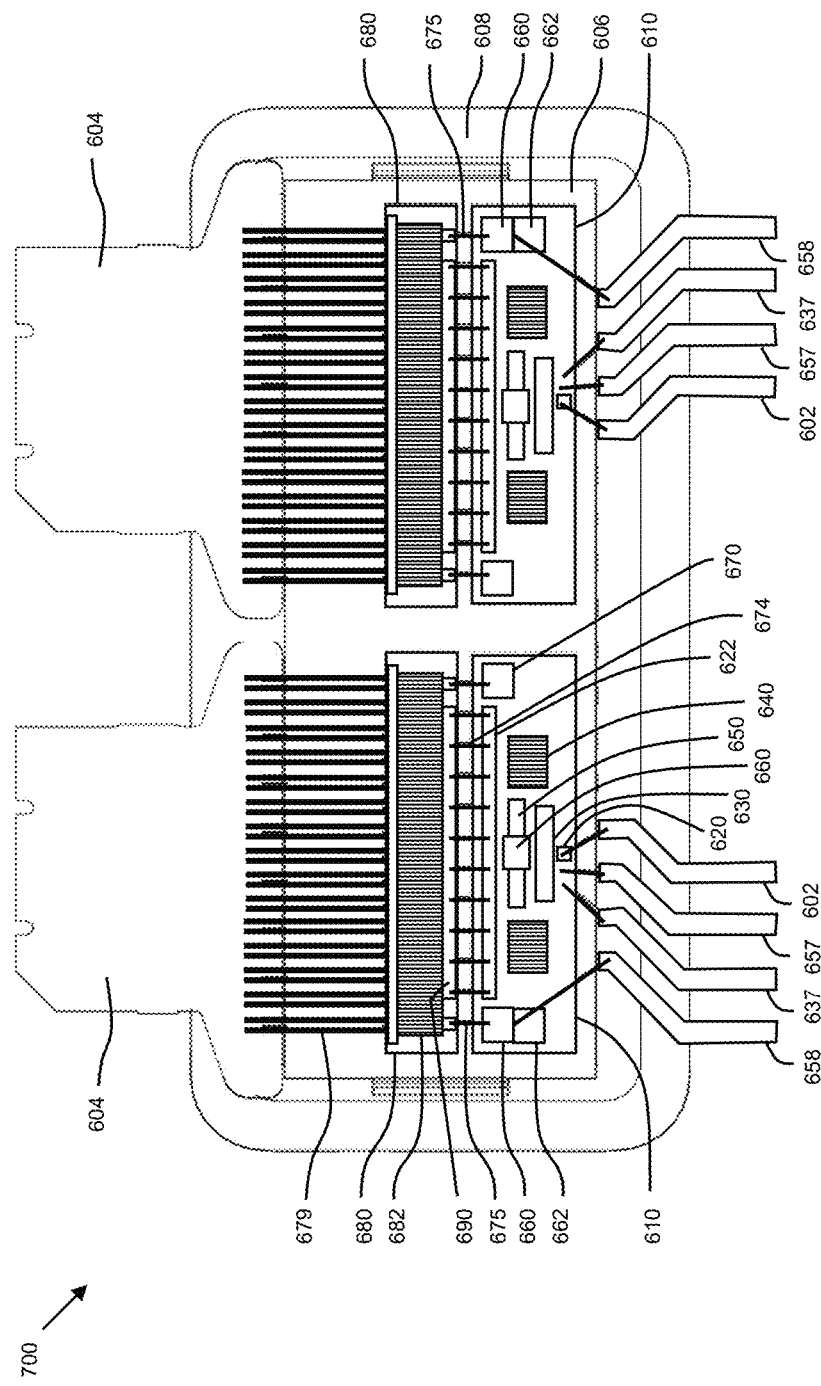
FIG. 6 is a top view of an example of an RF amplifier device that includes a two-stage amplifier packaged in a high-power package, in accordance with an example embodiment.

Various physical implementations of devices and circuits in which the inventive subject matter may be included will now be described in conjunction with FIGS. 6-8. Turning first to FIG. 6, a top view of an example of a packaged RF amplifier device 600 is illustrated, which includes a two-stage amplifier packaged in a high-power semiconductor device package, in accordance with an example embodiment. More specifically, the device 600 includes two parallel amplification paths housed in a high-power semiconductor device package. For purpose of brevity, many of the components and circuits of FIG. 6 that have similar counterparts in the embodiments of FIGS. 1, 2, 4, and 5 are not discussed in detail below. The details of corresponding components discussed above in conjunction with FIGS. 1, 2, 4, and 5 are intended to apply also to the corresponding components discussed below in conjunction with FIG. 6.

Each amplification path includes a driver stage die or IPD 610 and a GaN amplifier die 680 physically connected to the top surface of a substrate 606, in accordance with an example embodiment. Further, each of the amplification paths is electrically coupled between input and output leads 602, 604 (e.g., corresponding to inputs 102, 202, 402, 502 and outputs 104, 204, 404, 504, respectively). Bias leads 637, 657, 658 may be coupled to external bias circuitry (e.g., external bias voltage sources 137, 164) to receive gate and drain bias voltages, and to convey the bias voltages to circuitry internal to the device 600, as discussed in more detail below.

According to an embodiment, device 600 may be incorporated in an air cavity package, in which dies/IPD 610, 680 are located within an enclosed air cavity. Basically, the air cavity is bounded by substrate 606, an isolation structure 608 attached to the top surface of substrate 606, and a cap (not shown) overlying and in contact with the isolation structure 608 and the leads 602, 604, 637, 657, 658. The input, output, and bias leads 602, 604, 637, 657, 658 are mounted on a top surface of the isolation structure 606 on opposed sides of a central opening. In other embodiments, a device may be incorporated into an overmolded package (i.e., a package in which the electrical components within the active device area are encapsulated with a non-conductive molding compound, and in which portions of the leads 602, 604, 637, 657, 658 also may be encompassed by the molding compound).

Either way, the substrate 606 has a top and bottom surface (only the top surface is visible in FIG. 6), and a substantially-rectangular perimeter that corresponds to the perimeter of the device 600. In an embodiment, the substrate 606 includes a flange, which is a rigid electrically-conductive substrate formed from a solid conductive material, and which has a thickness that is sufficient to provide structural support for electrical components and elements of device 600. In addition, the flange may function as a heat sink for the amplifier dies/IPD 610, 680 and other devices mounted on the flange. Alternatively, substrate 606 may have one or more layers of non-conductive material below its top surface. Either way, substrate 606 has a conductive top surface.

The below description will describe a first one of the amplification paths in more detail. It is to be understood that the second amplification path may be identical to or substantially similar to the first amplification path. However, in other embodiments, the second amplification path may be differently configured from the first amplification path. Further, in other embodiments, more than two amplification paths may be housed together in a high-power semiconductor device package.

The first amplifier path includes a driver stage die or input IPD 610 (e.g., driver stage die 110, 210, 410 or IPD 510, FIGS. 1, 2, 4, 5) and a GaN amplifier die 680 (e.g., die 180, 280, FIGS. 1, 2, 4, 5), which are electrically coupled together in a cascade arrangement between an RF signal input lead 602 (e.g., input 102, 202, 402, 502, FIGS. 1, 2, 4, 5) and an RF signal output lead 604 (e.g., output 104, 204, 404, 504, FIGS. 1, 2, 4, 5).

The driver stage die or IPD 610 includes a plurality of integrated circuits. According to some embodiments, when element 610 is a driver stage die (e.g., die 110, 210, 410, FIGS. 1, 2, 4), the integrated circuitry of die 610 includes an input terminal 620 (e.g., input terminal 120, 220, 420), an output terminal 622 (e.g., output terminal 122, 222, 422), an input impedance matching circuit 630 (e.g., circuit 130, 230, 430), one or more driver stage transistors 640 (e.g., transistor(s) 140, 240, 440-444), an integrated portion of an interstage impedance matching circuit 650 (e.g., circuit 150, 250, 450), a bias voltage control circuit 660 (e.g., circuit 160, 260, 460), an ESD protection circuit 662 (e.g., circuit 162, 262, 462), and, in some embodiments, an integrated portion of a harmonic control circuit 670 (e.g., circuit 170, 270, 470), in an embodiment. In the embodiment illustrated in FIG. 6, the driver stage transistor 640 is implemented in two, parallel sections. In other embodiments, the driver stage transistor 640 may be implemented in a single section, or in more than two sections. According to other embodiments, when element 610 is an IPD (e.g., IPD 510, FIG. 5), the integrated circuitry of IPD 610 includes an input terminal 620 (e.g., input terminal 520), an output terminal 622 (e.g., output terminal 522), an input impedance matching circuit 630 (e.g., circuit 530), a bias voltage control circuit 660 (e.g., circuit 560), an ESD protection circuit 662 (e.g., circuit 562), and, in some embodiments, an integrated portion of a harmonic control circuit 670 (e.g., circuit 570). The various circuits and components within the driver stage die or IPD 610 may be configured and electrically coupled together as described previously in conjunction with FIGS. 1, 2, 4, and 5.

The RF signal input lead 602 is electrically coupled to the input terminal 620 of the driver stage die or IPD 610 through one or more wirebonds or other electrical connections (e.g., corresponding to connection 103, 203, 403, 503). Bias leads 637, 657, 658 are electrically coupled (e.g., via terminals 139, 158, 239, 257, 258, 437, 457, 458, 558) to corresponding bias voltage control circuitry connected to the silicon transistor gate, bias voltage control circuitry connected to the silicon transistor drain, and bias voltage control circuitry 660 for the GaN transistor, respectively. According to at least one embodiment, bias lead 658 is electrically coupled through one or more wirebonds to gate bias voltage circuit 660 (e.g., circuit 160, 260, 460, 560) that is integrally formed with and/or coupled to the driver stage die or IPD 610. As discussed in detail above, the gate bias voltage circuit 660, in turn, is electrically coupled (e.g., through wirebond connection 675 (e.g., connection 175, 275, 475, 575, FIGS. 1, 2, 4, 5) to the input/gate terminal (e.g., terminal 184, 284, FIGS. 1, 2, 4, 5) of a GaN amplifier 682 (e.g., amplifier 182, 282, FIGS. 1, 2, 4, 5) integrally formed in the GaN amplifier die 680. In addition, the gate bias voltage circuit 660 is electrically coupled to an ESD protection circuit 662 (e.g., ESD protection circuit 162, 262, 462, 562), which is configured to protect the gate oxide of the GaN transistor 682 on the GaN amplifier die 680 from energy associated with ESD events.

The final stage die 680 includes a plurality of integrated circuits. In an embodiment, the integrated circuitry of die 680 includes an input terminal 690 (e.g., input terminal 190, 290), an output terminal 692 (e.g., output terminal 192, 292), and a GaN power transistor 682 (e.g., transistor 182, 282). The various circuits and components within the final stage die 680 may be configured and electrically coupled together as described previously in conjunction with FIGS. 1, 2, 4, and 5.

The output terminal 622 of the driver stage die or IPD 610 is electrically coupled to the input terminal 690 of the final stage die 680 through a wirebond array 674 (e.g., corresponding to connections 174, 274, 474, 574). The input terminal 690 is electrically coupled to the gate of the GaN power transistor 682. The gate of the GaN power transistor 682 also may be electrically coupled through one or more wirebonds 678 (e.g., corresponding to connections 178, 278, 478, 578) to the integrated portion of a harmonic control circuit 670 (e.g., circuit 170, 270, 470, 570) in the driver stage die or IPD 610. The output terminal 692 of the final stage die 680 is electrically coupled, through wirebond array 679 (e.g., corresponding to connections 179, 279) to output lead 604.

Figure 7:
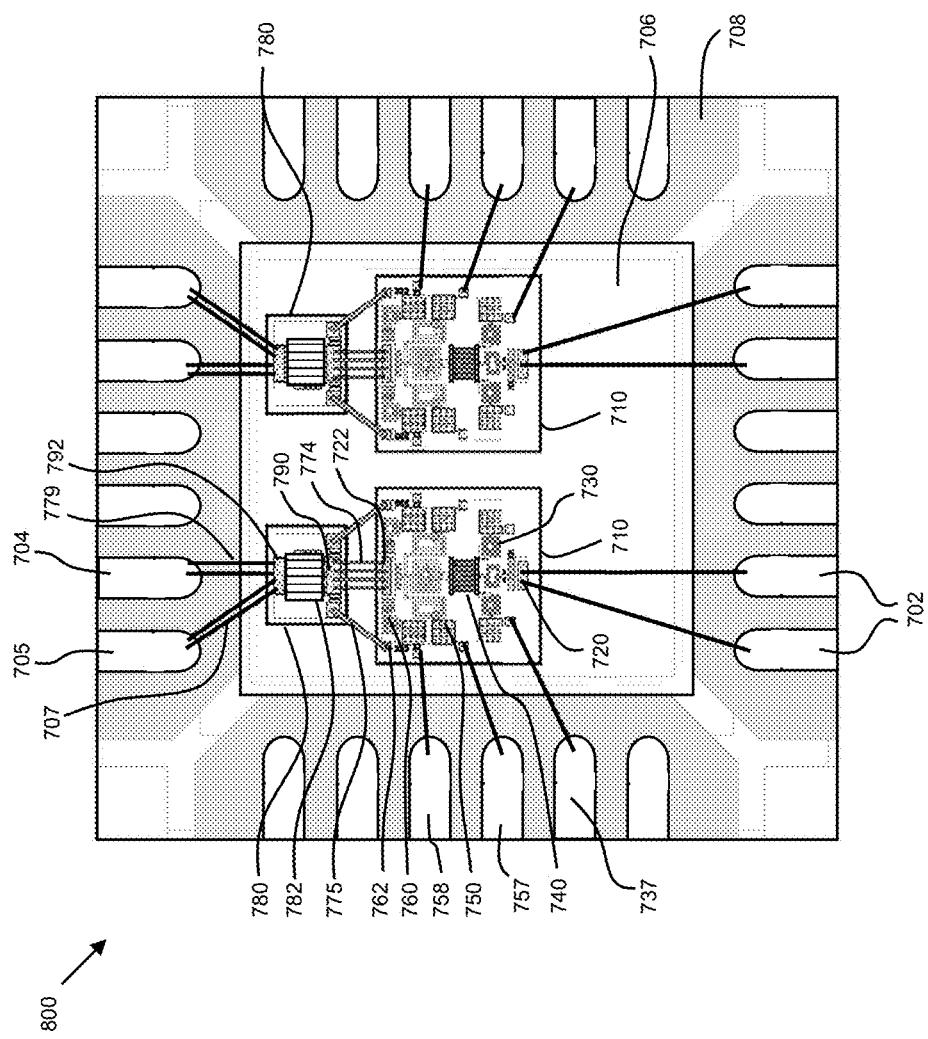
FIG. 7 is a top view of an example of an RF amplifier device that includes a two-stage amplifier packaged in a quad flat no-leads package, in accordance with an example embodiment.

Turning next to FIG. 7, a top view of an example of a packaged RF amplifier device 700 is illustrated, which includes a two-stage amplifier packaged in a quad flat no-leads (QFN) semiconductor device package, in accordance with an example embodiment. More specifically, the device 700 includes two parallel amplification paths housed in a QFN semiconductor device package. For purpose of brevity, many of the components and circuits of FIG. 7 that have similar counterparts in the embodiments of FIGS. 1-5 are not discussed in detail below. The details of corresponding components discussed above in conjunction with FIGS. 1, 2, 4, and 5 are intended to apply also to the corresponding components discussed below in conjunction with FIG. 7.

The QFN package includes a conductive substrate 706 and a plurality of perimeter lands (e.g., lands 702, 704, 737, 757, 758) that are physically coupled together with non-conductive encapsulation 708. Each amplification path includes a driver stage die or IPD 710 and a GaN amplifier die 780 physically connected to the top surface of a substrate 706, in accordance with an example embodiment. Further, each of the amplification paths is electrically coupled between input and output lands 702, 704 (e.g., corresponding to inputs 102, 202, 402, 502 and outputs 104, 204, 404, 504, respectively). Bias lands 737, 757, 758 may be coupled to external bias circuitry (e.g., external bias voltage sources 137, 164) to receive gate and drain bias voltages, and to convey the bias voltages to circuitry internal to the device 700, as discussed in more detail below.

In an embodiment, the substrate 706 includes a flange, which is a rigid electrically-conductive substrate formed from a solid conductive material, and which has a thickness that is sufficient to provide structural support for electrical components and elements of device 700. In addition, the flange may function as a heat sink for the amplifier dies or IPDs 710, 780 and other devices mounted on the flange.

The below description will describe a first one of the amplification paths in more detail. It is to be understood that the second amplification path may be identical to or substantially similar to the first amplification path. However, in other embodiments, the second amplification path may be differently configured from the first amplification path. Further, in other embodiments, more than two amplification paths may be housed together in a QFN semiconductor device package.

The first amplifier path includes a driver stage die or input IPD 710 (e.g., driver stage die 110, 210, 410 or IPD 510, FIGS. 1, 2, 4, 5) and a GaN amplifier die 780 (e.g., die 180, 280, FIGS. 1, 2, 4, 5), which are electrically coupled together in a cascade arrangement between an RF signal input land 702 (e.g., input 102, 202, 402, 502, FIGS. 1, 2, 4, 5) and an RF signal output land 704 (e.g., output 104, 204, 404, 504, FIGS. 1, 2, 4, 5).

The driver stage die or IPD 710 includes a plurality of integrated circuits. According to some embodiments, when element 710 is a driver stage die (e.g., die 110, 210, 410, FIGS. 1, 2, 4), the integrated circuitry of die 710 includes an input terminal 720 (e.g., input terminal 120, 220, 420), an output terminal 722 (e.g., output terminal 122, 222, 422), an input impedance matching circuit 730 (e.g., circuit 130, 230, 430), one or more driver stage transistors 740 (e.g., transistor(s) 140, 240, 440-444), an integrated portion of an interstage impedance matching circuit 750 (e.g., circuit 150, 250, 450), a bias voltage control circuit 760 (e.g., circuit 160, 260, 460), an ESD protection circuit 762 (e.g., circuit 162, 262, 462), and, in some embodiments, an integrated portion of a harmonic control circuit 770 (e.g., circuit 170, 270, 470), in an embodiment. According to other embodiments, when element 710 is an IPD (e.g., IPD 510, FIG. 5), the integrated circuitry of IPD 710 includes an input terminal 720 (e.g., input terminal 520), an output terminal 722 (e.g., output terminal 522), an input impedance matching circuit 730 (e.g., circuit 530), a bias voltage control circuit 760 (e.g., circuit 560), an ESD protection circuit 762 (e.g., circuit 562), and, in some embodiments, an integrated portion of a harmonic control circuit 770 (e.g., circuit 570). The various circuits and components within the driver stage die or IPD 710 may be configured and electrically coupled together as described previously in conjunction with FIGS. 1, 2, 4, and 5.

The RF signal input land 702 is electrically coupled to the input terminal 720 of the driver stage die or IPD 710 through one or more wirebonds or other electrical connections (e.g., corresponding to connection 103, 203, 403, 503). Bias lands 737, 757, 758 are electrically coupled (e.g., via terminals 139, 158, 239, 257, 258, 437, 457, 458, 558) to corresponding bias voltage control circuitry connected to the silicon transistor gate, bias voltage control circuitry connected to the silicon transistor drain, and bias voltage control circuitry 760 for the GaN transistor, respectively. According to at least one embodiment, bias land 758 is electrically coupled through one or more wirebonds to gate bias voltage circuit 760 (e.g., circuit 160, 260, 460, 560) that is integrally formed with and/or coupled to the driver stage die or IPD 710. As discussed in detail above, the gate bias voltage circuit 760, in turn, is electrically coupled (e.g., through wirebond connection 775 (e.g., connection 175, 275, 475, 575, FIGS. 1, 2, 4, 5) to the input/gate terminal (e.g., terminal 184, 284, FIGS. 1, 2, 4, 5) of a GaN amplifier 782 (e.g., amplifier 182, 282, FIGS. 1, 2, 4, 5) integrally formed in the GaN amplifier die 780. In addition, the gate bias voltage circuit 760 is electrically coupled to an ESD protection circuit 762 (e.g., ESD protection circuit 162, 262, 462, 562), which is configured to protect the gate oxide of the GaN transistor 782 on the GaN amplifier die 780 from energy associated with ESD events.

The final stage die 780 includes a plurality of integrated circuits. In an embodiment, the integrated circuitry of die 780 includes an input terminal 790 (e.g., input terminal 190, 290), an output terminal 792 (e.g., output terminal 192, 292), and a GaN power transistor 782 (e.g., transistor 182, 282). The various circuits and components within the final stage die 780 may be configured and electrically coupled together as described previously in conjunction with FIGS. 1, 2, 4, and 5.

The output terminal 722 of the driver stage die or IPD 710 is electrically coupled to the input terminal 790 of the final stage die 780 through a wirebond array 774 (e.g., corresponding to connections 174, 274, 474, 574). The input terminal 790 is electrically coupled to the gate of the GaN power transistor 782. The gate of the GaN power transistor 782 also may be electrically coupled through one or more wirebonds 778 (e.g., corresponding to connections 178, 278, 478, 578) to the integrated portion of a harmonic control circuit 770 (e.g., circuit 170, 270, 470, 570) in the driver stage die or IPD 710. The output terminal 792 of the final stage die 780 is electrically coupled, through wirebond array 779 (e.g., corresponding to connections 179, 279) to output land 704.

The devices 600, 700 depicted in FIGS. 6 and 7 each include two parallel amplification paths that independently amplify RF input signals to produce separate amplified RF output signals. Other embodiments may include more than two amplification paths (e.g., three, four, or some other number of paths). In some embodiments, multiple amplification paths may be electrically coupled together as part of a multi-path amplifier system. For example, the device embodiments described in conjunction with FIGS. 1, 2, 4, and 5 may be implemented in a Doherty power amplifier. A two-way Doherty power amplifier includes an RF input configured to receive an RF signal, a signal splitter configured to divide the input RF signal into first and second input RF signals, a main amplification path configured to amplify the first RF signal, a peaking amplification path configured to amplify the second input RF signal, a signal combiner configured to combine the amplified output signals from the main and peaking amplification paths, and an RF output configured to output the combined and amplified RF output signal. In addition, the two-way Doherty power amplifier includes various phase delay and impedance transformation elements, which enable correct operation of the Doherty power amplifier. Some Doherty power amplifier configurations may include more than one peaking amplifier path, and such Doherty power amplifiers are referred to as N-way Doherty power amplifiers, where the number of peaking amplifier paths equals N−1.

In various embodiments, a two-stage amplifier with a silicon driver stage die (or an input IPD) and a GaN final stage die is incorporated into one or more amplification paths of a Doherty power amplifier module. For example, such a two-stage amplifier may be incorporated into a main amplification path, a peaking amplification path, multiple peaking amplification paths, or any combination of main and peaking amplification paths. An example embodiment in which two-stage amplifiers, each with a driver stage die and a GaN final stage die, are incorporated into main and peaking amplification paths is illustrated in FIG. 9. Those of skill in the art would understand, based on the description herein, that other embodiments may include two-stage amplifiers with a driver stage die and a GaN final stage die in a main amplifier path and multiple peaking amplifier paths. Still other embodiments may include single-stage amplifiers in which each of the main and peaking amplifier paths include an input IPD and a GaN amplifier die.

Figure 8:
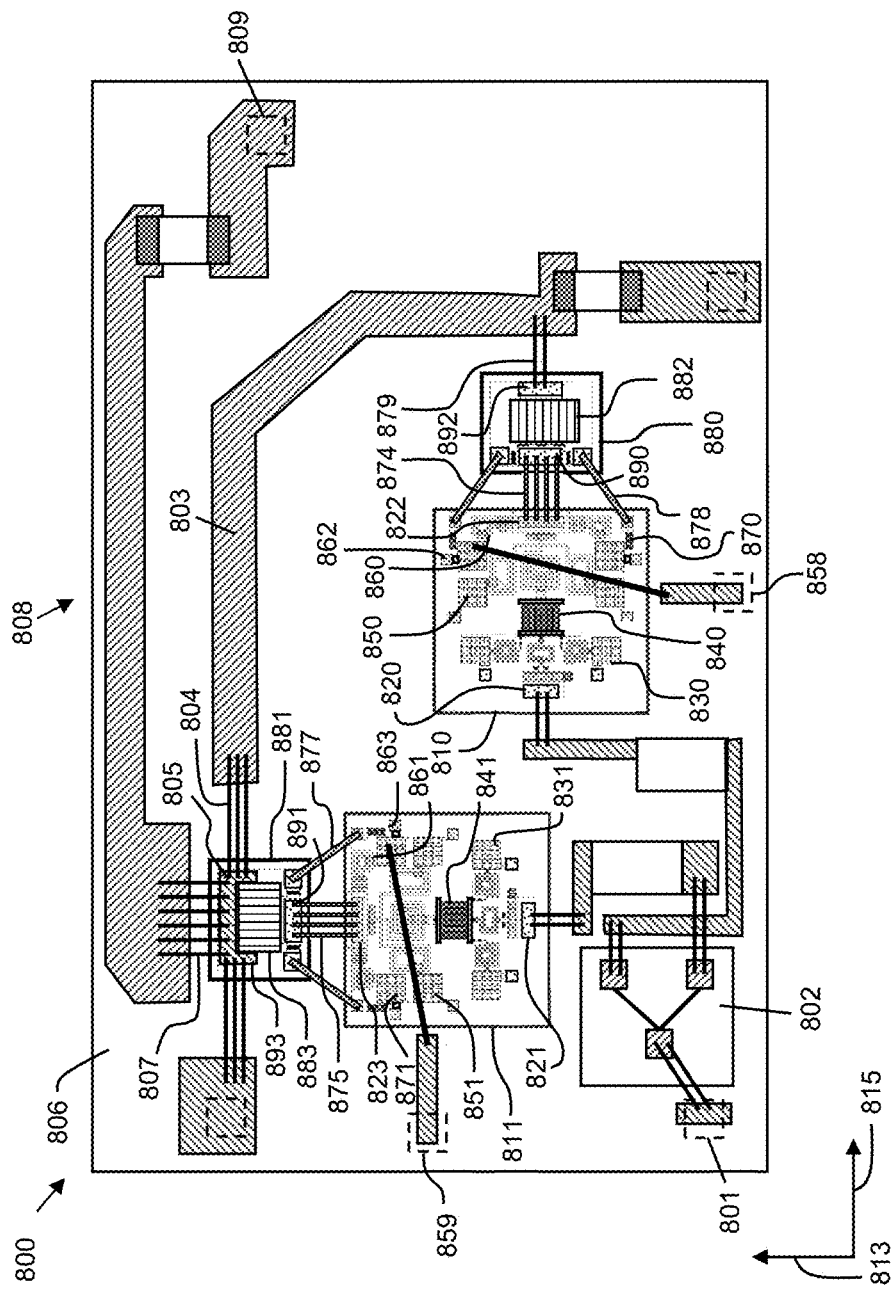
FIG. 8 is a top view of an example of an RF amplifier device that includes a two-stage main amplifier in a Doherty power amplifier module, in accordance with an example embodiment.

More specifically, FIG. 8 is a top view of an example of an RF amplifier device 800 that includes a Doherty power amplifier with a main amplification path and a peaking amplification path, where the main amplification path includes a driver stage die 810 and a GaN final stage die 880, and the peaking amplification path also includes a driver stage die 811 and a GaN final stage die 881, in accordance with an example embodiment. RF amplifier device 800 will alternatively be referred to below as a "Doherty power amplifier module." For purpose of brevity, many of the components and circuits of FIG. 8 that have similar counterparts in the embodiments of FIGS. 1, 2, 4, and 5 are not discussed in detail below. The details of corresponding components discussed above in conjunction with FIGS. 1, 2, 4, and 5 are intended to apply also to the corresponding components discussed below in conjunction with FIG. 8.

The Doherty power amplifier module 800 includes a substrate in the form of a multiple-layer PCB 806, which includes at least one dielectric layer (e.g., formed from FR-4, ceramic, or other PCB dielectric materials), and two or more conductive layers. In an embodiment, the conductive layer on the top surface of the PCB 806 is a patterned conductive layer. Various conductive features (e.g., conductive pads and traces) formed from portions of the top patterned conductive layer may serve as attachment points for dies 810, 811, 880, 881 and other discrete components, and also may provide electrical connectivity between the dies 810, 811, 880, 881 and the other discrete components. Another conductive layer may serve as a ground reference plane. In some embodiments, one or more additional patterned conductive layers may provide conductive connections between the dies 810, 811, 880, 881, the discrete components, and the ground reference plane. According to an embodiment, a bottom conductive layer is utilized to provide externally-accessible, conductive landing pads, where the locations of some example landing pads 801, 809, 858, 859 are indicated with dashed boxes in FIG. 8. These landing pads (among others, not illustrated) enable surface mounting of the Doherty power amplifier module 800 onto a separate substrate (not illustrated) that provides electrical connectivity to other portions of an RF system. Although module 800 is depicted as a land grid array (LGA) module, module 800 alternatively may be packaged as a pin grid array module, a QFN module, or another type of package.

The Doherty power amplifier module 800 further includes an RF signal input terminal, a power splitter 802, a two-stage, main amplifier that includes a cascade-coupled driver stage die 810 and GaN final stage die 880, a two-stage peaking amplifier that includes a cascade-coupled driver stage die 811 and GaN final stage die 881, various phase shift and impedance matching elements, and a combiner. A conductive landing pad 801 exposed at the bottom surface of the PCB 806 functions as the RF signal input terminal for the module 800. Through one or more conductive structures (e.g., vias, traces, and/or wirebonds), the landing pad 801 is electrically coupled to an input to the power splitter 802.

The power splitter 802, which is coupled to the mounting surface of the PCB 806, may include one or more discrete die and/or components, although it is represented in FIG. 8 as a single element. The power splitter 802 includes an input terminal and two output terminals. The input terminal is electrically coupled through one or more conductive structures (e.g., vias, traces, and/or wirebonds) to the landing pad 801 to receive an input RF signal. The output terminals of the power splitter 802 are electrically coupled through one or more conductive structures (e.g., vias, traces, and/or wirebonds) to inputs 820, 821 for the main and peaking amplifiers, respectively.

The power splitter 802 is configured to split the power of the input RF signal received through the landing pad 801 into first and second RF signals, which are produced at the output terminals of the power splitter 802. In addition, the power splitter 802 may include one or more phase shift elements configured to impart about a 90 degree phase difference between the RF signals provided at the output terminals. The first and second RF signals produced at the outputs of the power splitter 802 may have equal or unequal power.

The first output of the power splitter is electrically coupled to a main amplifier path (i.e., to the main amplifier), and the second output of the power splitter is electrically coupled to a peaking amplifier path (i.e., to the peaking amplifier). In the illustrated embodiment, the RF signal produced at the second power splitter output is delayed by about 90 degrees from the RF signal produced at the first power splitter output. In other words, the RF signal provided to the peaking amplifier path is delayed by about 90 degrees from the RF signal provided to the main amplifier path.

The first RF signal produced by the power splitter 802 is amplified through the main amplifier path, which includes the driver stage die 810, the GaN final stage die 880, and a phase shift and impedance inversion element 803 (referred to simply as "phase shift element" herein). The second RF signal produced by the power splitter 802 is amplified through the peaking amplifier path, which includes the driver stage die 811, the GaN final stage die 881.

The driver stage die 810 and the GaN final stage die 880 of the main amplifier path are electrically coupled together in a cascade arrangement between an input terminal 820 of the driver stage die 810 (corresponding to a main amplifier input) and an output terminal 892 of the GaN final stage die 880 (corresponding to a main amplifier output). The driver stage die 810 includes a plurality of integrated circuits. In an embodiment, the integrated circuitry of die 810 includes the input terminal 820 (e.g., input terminal 120, 220, 420, 520), an output terminal 822 (e.g., output terminal 122, 222, 422, 522), an input impedance matching circuit 830 (e.g., circuit 130, 230, 430, 530), a silicon power transistor 840 (e.g., transistor 140, 240, 440-444), an integrated portion of an interstage impedance matching circuit 850 (e.g., circuit 150, 250, 450), a bias voltage control circuit 860 (e.g., circuit 160, 260, 460, 560), an ESD protection circuit 862 (e.g., circuits 162, 262, 462, 562), and an integrated portion of a harmonic control circuit 870 (e.g., circuit 170, 270, 470, 570), in an embodiment. The various circuits and components within the driver stage die 810 may be configured and electrically coupled together as described previously in conjunction with FIGS. 1, 2, 4, and 5.

The first output of the power divider 802 is electrically coupled to the input terminal 820 of the driver stage die 810 through various conductive traces, circuitry, and wirebonds or other types of electrical connections (e.g., corresponding to connection 203, 303, 403, 503). A bias land 858 is electrically coupled through additional conductive structures, a wirebond (or other types of electrical connections), and a terminal (e.g., terminals 158, 258, 458 or 558) to corresponding bias voltage control circuitry 860 for the GaN transistor 882. In addition, the bias land 858 is electrically coupled to the ESD protection circuit 862 (e.g., circuit 162, 262, 462, 562), which is configured to protect the gate oxide of the GaN transistor 882 from energy associated with ESD events. Although not shown in FIG. 8, additional bias lands may be electrically coupled to bias voltage control circuitry for the silicon transistor gate and drain.

The GaN final stage die 880 includes a plurality of integrated circuits. In an embodiment, the integrated circuitry of die 880 includes an input terminal 890 (e.g., input terminal 190, 290, 490, 590), an output terminal 892 (e.g., output terminal 192, 292, 492, 592), and a GaN power transistor 882 (e.g., transistor 182, 282, 482, 582). The various circuits and components within the GaN final stage die 880 may be configured and electrically coupled together as described previously in conjunction with FIGS. 1, 2, 4, and 5.

The output terminal 822 of the driver stage die 810 is electrically coupled to the input terminal 890 of the GaN final stage die 880 through a wirebond array 874 or another type of electrical connection (e.g., corresponding to connections 174, 274, 474, 574). The input terminal 890 is electrically coupled to the gate of the GaN power transistor 882. The gate of the GaN power transistor 882 is electrically coupled through one or more wirebonds (not numbered) to the bias voltage control circuitry 860 and the ESD protection circuit 862 on the driver stage die 810. The gate of the GaN power transistor 882 also is electrically coupled through one or more wirebonds 878 or another type of electrical connection (e.g., corresponding to connections 178, 278, 478, 578) to the integrated portion of a harmonic control circuit 870 in the driver stage die 810.

The amplified first RF signal is produced at the output terminal 892 of the GaN final stage die 880. According to an embodiment, the output terminal 892 is electrically coupled (e.g., through wirebonds 879 or another type of electrical connection) to phase shift element 803. According to an embodiment, phase shift element 803 has a first end that is proximate to the output terminal 892 of the GaN final stage die 880, and a second end that is proximate to the output terminal 893 of the GaN final stage die 881. For example, the phase shift element 803 may be implemented with a lambda/4 (λ/4) transmission line (e.g., a microstrip transmission line with a 90 degree electrical length) that extends between its first and second ends. The phase shift element 803 may impart about a 90 degree relative phase shift to the amplified first RF signal as the signal travels from the phase shift element's first end to its second end.

As mentioned above, the second RF signal produced by the power splitter 802 is amplified through the peaking amplifier path, which includes the driver stage die 811 and the GaN final stage die 881. The driver stage die 811 and the GaN final stage die 881 of the peaking amplifier path are electrically coupled together in a cascade arrangement between an input terminal 821 of the driver stage die 811 (corresponding to a peaking amplifier input) and an output terminal 893 of the GaN final stage die 881 (corresponding to a peaking amplifier output). The driver stage die 811 includes a plurality of integrated circuits. In an embodiment, the integrated circuitry of die 811 includes the input terminal 821 (e.g., input terminal 120, 220, 420, 520), an output terminal 823 (e.g., output terminal 122, 222, 422, 522), an input impedance matching circuit 831 (e.g., circuit 130, 230, 430, 530), a silicon power transistor 841 (e.g., transistor 140, 240, 440-444), an integrated portion of an interstage impedance matching circuit 851 (e.g., circuit 150, 250, 450), a bias voltage control circuit 861 (e.g., circuit 160, 260, 460, 560), an ESD protection circuit 863 (e.g., circuits 162, 262, 462), and an integrated portion of a harmonic control circuit 871 (e.g., circuit 170, 270, 470, 570), in an embodiment. The various circuits and components within the driver stage die 811 may be configured and electrically coupled together as described previously in conjunction with FIGS. 1, 2, 4, and 5.

The second output of the power divider 802 is electrically coupled to the input terminal 821 of the driver stage die 811 through various conductive traces, circuitry, and wirebonds or another type of electrical connection (e.g., corresponding to connection 203, 403, 503). A bias land 859 is electrically coupled through additional conductive structures, a wirebond (or another type of electrical connection), and a terminal (e.g., terminals 158, 258, 458 or 558) to corresponding bias voltage control circuitry 861 for the GaN transistor 883. In addition, the bias land 859 is electrically coupled to the ESD protection circuit 863 (e.g., circuit 162, 262, 462, 562), which is configured to protect the gate oxide of the GaN transistor 883 from energy associated with ESD events. Although not shown in FIG. 8, additional bias lands may be electrically coupled to bias voltage control circuitry for the silicon transistor gate and drain.

The GaN final stage die 881 includes a plurality of integrated circuits. In an embodiment, the integrated circuitry of die 881 includes an input terminal 891 (e.g., input terminal 190, 290), an output terminal 893 (e.g., output terminal 192, 292), and a GaN power transistor 883 (e.g., transistor 182, 282). The various circuits and components within the GaN final stage die 881 may be configured and electrically coupled together as described previously in conjunction with FIGS. 1, 2, 4, and 5.

The output terminal 823 of the driver stage die 811 is electrically coupled to the input terminal 891 of the GaN final stage die 881 through a wirebond array 875 or another type of electrical connection (e.g., corresponding to connections 174, 274). The input terminal 891 is electrically coupled to the gate of the GaN power transistor 883. The gate of the GaN power transistor 883 is electrically coupled through one or more wirebonds (not numbered) to the bias voltage control circuitry 861 and the ESD protection circuit 863 on the driver stage die 811. The gate of the GaN power transistor 883 also is electrically coupled through one or more wirebonds 877 or another type of electrical connection (e.g., corresponding to connections 178, 278, 478, 578) to the integrated portion of a harmonic control circuit 871 in the driver stage die 811.

The signal path through the cascade-coupled peaking amplifier dies 811, 881 is in a direction extending from the RF input terminal 821 to the RF output terminal 893, which direction is indicated by arrow 813. Conversely, the signal path through the cascade-coupled main amplifier dies 810, 880 is in a direction extending from the driver stage die input terminal 820 to the GaN final stage die output terminal 892, which direction is indicated by arrow 815. As can be seen in FIG. 8, the signal paths through the cascade-coupled peaking amplifier dies 811, 881 and the cascade-coupled main amplifier dies 810, 880 extend in significantly different directions, and more particularly the signal paths are orthogonal in the embodiment of FIG. 8. Said another way, the RF signal path through the dies 811, 881 is orthogonal to the RF signal path through the dies 810, 880. Even though the die 810, 811, 880, 881 may be positioned relatively close together, their orthogonal orientations may significantly reduce coupling between signals carried through and amplified by the main and peaking amplifier paths.

In any event, the amplified second RF signal is produced by the GaN final stage die 881 at the RF output terminal 893. According to an embodiment, the RF output terminal 893 is electrically coupled (e.g., through wirebonds 804 or another type of electrical connection) to the second end of the phase shift element 803. Accordingly, the amplified first RF signal produced by the GaN final stage die 880 is conveyed to the RF output terminal 893, and the output terminal 893 functions as a summing node 805 for the amplified first and second RF signals. When the various phase shifts imparted separately on the first and second RF signals are substantially equal, the amplified first and second RF signals combine substantially in phase at summing node 805.

The RF output terminal 893 (and thus summing node 805) is electrically coupled (e.g., through wirebonds 807 or another type of electrical connection) to an output network 808, which functions to present the proper load impedances to each of main and peaking amplifier dies 880, 881. In addition, the output network 808 may include a decoupling capacitor, as shown. Although the detail is not shown in FIG. 8, the output network 808 may include various conductive traces, additional discrete components, and/or integrated components (e.g., capacitors, inductors, and/or resistors) to provide the desired impedance matching. The output network 808 is electrically coupled through the PCB 806 to conductive landing pad 809 exposed at the bottom surface of the PCB 806. The landing pad 809 functions as the RF output node for the Doherty power amplifier module 800.

An embodiment of an amplifier includes a first semiconductor die and a substrate that is distinct from the first semiconductor die. The first semiconductor die includes a III-V semiconductor substrate, a first RF signal input terminal, a first RF signal output terminal, and a first transistor. The first transistor has a control terminal electrically coupled to the first RF signal input terminal, and a current-carrying terminal electrically coupled to the first RF signal output terminal. The substrate includes a second RF signal input terminal, a second RF signal output terminal, circuitry coupled between the second RF signal input terminal and the second RF signal output terminal, and an electrostatic discharge (ESD) protection circuit. The amplifier also includes a connection electrically coupled between the ESD protection circuit and the control terminal of the first transistor.

According to a further embodiment, the first transistor is a depletion-mode GaN FET, the control terminal is a gate terminal, and the current-carrying terminal is a drain terminal. According to another further embodiment the ESD protection includes a diode with an anode and a cathode, and an ESD voltage clamping circuit coupled to the cathode. The anode is electrically coupled to the input terminal of a bias voltage control circuit on the substrate. According to another further embodiment, the substrate is a second semiconductor die formed from a different semiconductor material than the first semiconductor die, and the circuitry coupled between the second RF signal input terminal and the second RF signal output terminal includes one or more second transistors with a second control terminal and a second current-carrying terminal. The second control terminal is electrically coupled to the second RF signal input terminal, and the second current-carrying terminal is electrically coupled to the second RF signal output terminal. According to another further embodiment, the substrate is an integrated passive device (IPD), and the circuitry coupled between the second RF signal input terminal and the second RF signal output terminal includes an impedance matching circuit.

Another embodiment of an amplifier includes first and second semiconductor dies. The first semiconductor die includes a first RF signal input terminal, a first RF signal output terminal, a first transistor, and an electrostatic discharge (ESD) protection circuit. The first transistor has a control terminal electrically coupled to the first RF signal input terminal, and a current-carrying terminal electrically coupled to the first RF signal output terminal. The second semiconductor die includes a second RF signal input terminal, a second RF signal output terminal, and a gallium nitride (GaN) transistor. The GaN transistor has a control terminal electrically coupled to the second RF signal input terminal, and a current-carrying terminal electrically coupled to the second RF signal output terminal. The amplifier further includes a connection electrically coupled between the ESD protection circuit and the control terminal of the GaN transistor.

According to a further embodiment, the first semiconductor die is selected from a silicon substrate, a silicon germanium (SiGe) substrate, a silicon-on-insulator (SOI) substrate, and a SiGe-on-insulator (SGOI) substrate. According to another further embodiment, the second semiconductor die is selected from a GaN substrate, a GaN-on-silicon substrate, and a GaN-on-silicon carbide substrate.

According to yet another further embodiment, the amplifier is a Doherty power amplifier that includes a main amplifier, a peaking amplifier, and a summing node coupled to outputs of the main amplifier and the peaking amplifier. The main amplifier includes the first semiconductor die and the second semiconductor die, wherein the first RF signal input terminal of the first semiconductor die corresponds to a main amplifier input, and the second RF signal output terminal of the second semiconductor die corresponds to a main amplifier output. According to yet another further embodiment, the amplifier also includes a substrate to which the main amplifier and the peaking amplifier are coupled, and a phase shift and impedance inversion element electrically coupled between the second RF signal output terminal, and the summing node.

The preceding detailed description is merely illustrative in nature and is not intended to limit the embodiments of the subject matter or the application and uses of such embodiments. For example, although the above description discusses the use of a GaN FET integrated into a GaN die in various embodiments, other types of III-V transistors (e.g., GaAs transistors, indium phosphide (InP) transistors, and so on) integrated into other types of III-V semiconductor die (e.g., GaAs die, InP die, and so on) may be used as a power amplifier die, in other embodiments.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier comprising:
a first semiconductor die that includes a III-V semiconductor substrate, a first radio frequency (RF) signal input terminal, a first RF signal output terminal, and a first transistor, wherein the first transistor has a control terminal electrically coupled to the first RF signal input terminal, and a current-carrying terminal electrically coupled to the first RF signal output terminal;
a substrate that is distinct from the first semiconductor die, wherein the substrate includes a second RF signal input terminal, a second RF signal output terminal, circuitry coupled between the second RF signal input terminal and the second RF signal output terminal, and a first electrostatic discharge (ESD) protection circuit; and
a first connection direct-current (DC) coupled between the first ESD protection circuit and the control terminal of the first transistor.

2. The amplifier of claim 1, wherein:
the first transistor is a depletion-mode gallium nitride field effect transistor, the control terminal is a gate terminal, and the current-carrying terminal is a drain terminal.

3. An amplifier comprising:
a first semiconductor die that includes a III-V semiconductor substrate, a first radio frequency (RF) signal input terminal, a first RF signal output terminal, and a first transistor, wherein the first transistor has a control terminal electrically coupled to the first RF signal input terminal, and a current-carrying terminal electrically coupled to the first RF signal output terminal;
a substrate that is distinct from the first semiconductor die, wherein the substrate includes a second RF signal input terminal, a second RF signal output terminal, circuitry coupled between the second RF signal input terminal and the second RF signal output terminal, and a first electrostatic discharge (ESD) protection circuit;
a first connection electrically coupled between the first ESD protection circuit and the control terminal of the first transistor; and
wherein:
the substrate further includes a first bias voltage control circuit, coupled to the first ESD protection circuit, wherein the first bias voltage control circuit includes a bias input terminal configured to be coupled to an external bias voltage source, and a bias output terminal configured to be coupled to the control terminal of the first transistor, wherein during operation, the bias output terminal conveys a DC bias voltage to the control terminal of the first transistor through the first connection.

4. The amplifier of claim 3, wherein the first bias voltage control circuit comprises:
a direct current-to-direct current (DC-DC) voltage converter electrically coupled between the bias input terminal and the bias output terminal, and wherein the DC-DC voltage converter is configured to convert a DC voltage provided to the bias input terminal into a negative DC voltage at the bias output terminal.

5. The amplifier of claim 3, wherein the first ESD protection comprises:
a diode with an anode and a cathode, wherein the anode is electrically coupled to the input terminal of the first bias voltage control circuit; and
an ESD voltage clamping circuit coupled to the cathode.

6. The amplifier of claim 5, wherein:
the substrate is a silicon substrate; and
the diode comprises a P-N junction polysilicon diode formed at least partially from a poly silicon layer of the silicon substrate.

7. The amplifier of claim 5, wherein:
the ESD voltage clamping circuit includes a second transistor with a gate terminal and a source terminal coupled to a ground node, and a drain terminal coupled to the diode.

8. The amplifier of claim 7, wherein the second transistor is a grounded gate (gg) n-channel MOSFET.

9. The amplifier of claim 1, wherein:
the substrate is a second semiconductor die formed from a different semiconductor material than the first semiconductor die, wherein the circuitry coupled between the second RF signal input terminal and the second RF signal output terminal includes one or more second transistors with a second control terminal and a second current-carrying terminal, wherein the second control terminal is electrically coupled to the second RF signal input terminal, and the second current-carrying terminal is electrically coupled to the second RF signal output terminal.

10. The amplifier of claim 9, wherein the second semiconductor die further comprises:
a second ESD circuit coupled to the second control terminal of the second transistor.

11. The amplifier of claim 9, further comprising:
a decoupling capacitor with a first terminal electrically coupled to the second current-carrying terminal, and a second terminal electrically coupled to the second RF signal output terminal.

12. The amplifier of claim 1, wherein:
the substrate is an integrated passive device (IPD), and wherein the circuitry coupled between the second RF signal input terminal and the second RF signal output terminal includes an impedance matching circuit.

13. The amplifier of claim 1, wherein the second RF signal output terminal of the substrate and the first RF signal input terminal of the first semiconductor die are electrically coupled together through the first connection.

14. The amplifier of claim 1, wherein the first connection comprises one or more wirebonds.

15. The amplifier of claim 1, further comprising:
a second connection electrically coupled between the second RF signal output terminal of the substrate and the first RF signal input terminal of the first semiconductor die.

16. An amplifier comprising:
a first semiconductor die that includes a first radio frequency (RF) signal input terminal, a first RF signal output terminal, a first transistor, and an electrostatic discharge (ESD) protection circuit, wherein the first transistor has a control terminal electrically coupled to the first RF signal input terminal, and a current-carrying terminal electrically coupled to the first RF signal output terminal;

a second semiconductor die that includes a second RF signal input terminal, a second RF signal output terminal, and a gallium nitride (GaN) transistor, wherein the GaN transistor has a control terminal electrically coupled to the second RF signal input terminal, and a current-carrying terminal electrically coupled to the second RF signal output terminal; and a first connection direct current (DC) coupled between the ESD protection circuit and the control terminal of the GaN transistor.

17. The amplifier of claim 16, wherein the first semiconductor die is selected from a silicon substrate, a silicon germanium (SiGe) substrate, a silicon-on-insulator (SOI) substrate, and a SiGe-on-insulator (SGOI) substrate.

18. The amplifier of claim 16, wherein the second semiconductor die is selected from a GaN substrate, a GaN-on-silicon substrate, and a GaN-on-silicon carbide substrate.

19. The amplifier of claim 16, wherein:

the amplifier is a Doherty power amplifier that includes a main amplifier, a peaking amplifier, and a summing node coupled to outputs of the main amplifier and the peaking amplifier; and the main amplifier includes the first semiconductor die and the second semiconductor die, wherein the first RF signal input terminal of the first semiconductor die corresponds to a main amplifier input, and the second RF signal output terminal of the second semiconductor die corresponds to a main amplifier output.

20. The amplifier of claim 19, further comprising:

a substrate to which the main amplifier and the peaking amplifier are coupled; and a phase shift and impedance inversion element electrically coupled between the second RF signal output terminal, and the summing node.

* * * * *